United States Patent
Kim et al.

(10) Patent No.: US 9,860,467 B2
(45) Date of Patent: Jan. 2, 2018

(54) IMAGE SENSOR HAVING DIFFERENT SUBSTRATE BIAS VOLTAGES

(71) Applicants: Seung-sik Kim, Hwaseong-si (KR); Moo-sup Lim, Yongin-si (KR); Ji-won Lee, Daegu (KR)

(72) Inventors: Seung-sik Kim, Hwaseong-si (KR); Moo-sup Lim, Yongin-si (KR); Ji-won Lee, Daegu (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 38 days.

(21) Appl. No.: 14/989,055

(22) Filed: Jan. 6, 2016

(65) Prior Publication Data

US 2016/0249002 A1 Aug. 25, 2016

(30) Foreign Application Priority Data

Feb. 25, 2015 (KR) .................. 10-2015-0026749

(51) Int. Cl.
*H04N 5/335* (2011.01)
*H04N 5/3745* (2011.01)
*H01L 27/146* (2006.01)
*H04N 5/355* (2011.01)
*H04N 5/359* (2011.01)

(52) U.S. Cl.
CPC ..... *H04N 5/3745* (2013.01); *H01L 27/14612* (2013.01); *H01L 27/14654* (2013.01); *H04N 5/3559* (2013.01); *H04N 5/3591* (2013.01)

(58) Field of Classification Search
CPC .................................................. H04N 5/3745
See application file for complete search history.

(56) References Cited

U.S. PATENT DOCUMENTS

| | | | |
|---|---|---|---|
| 6,586,789 B1 | 7/2003 | Zhao | |
| 6,853,044 B1 | 2/2005 | Chung et al. | |
| 7,538,372 B2 | 5/2009 | Rhodes | |
| 7,667,178 B2 | 2/2010 | Bae et al. | |
| 7,829,368 B2 | 11/2010 | Patrick | |
| 8,319,262 B2 | 11/2012 | Janesick | |
| 8,362,532 B2 | 1/2013 | Hynecek | |
| 8,493,489 B2 | 7/2013 | Oike et al. | |
| 8,629,023 B2 | 1/2014 | Lee | |

(Continued)

FOREIGN PATENT DOCUMENTS

KR 102010007080 6/2010

*Primary Examiner* — Gary C Vieaux
(74) *Attorney, Agent, or Firm* — Harness, Dickey & Pierce, P.L.C.

(57) ABSTRACT

An image sensor having different bias voltages is provided. The image sensor may include a plurality of pixels configured to output pixel signals based on a received optical signal, and logic circuits configured to output the pixels signals as image data. The pixels may be formed on a first region of a semiconductor substrate, the first region being substrate biased to a first voltage. The logic circuits may be formed on a second region of the semiconductor substrate different from the first region, the second region being substrate biased to a second voltage different from the first voltage. A full-well capacitance (FWC) of the photodiode may be increased by applying the first voltage, which is a negative (−) voltage, to a photodiode of a pixel to reduce (or, alternatively prevent) a blooming effect.

19 Claims, 23 Drawing Sheets

(56) References Cited

U.S. PATENT DOCUMENTS

| | | |
|---|---|---|
| 2008/0266435 A1 | 10/2008 | Agranov et al. |
| 2009/0066782 A1* | 3/2009 | Choi ..................... H04N 3/155 |
| | | 348/25 |
| 2009/0294816 A1 | 12/2009 | Park et al. |
| 2011/0019045 A1 | 1/2011 | Lin |
| 2011/0024808 A1* | 2/2011 | Janesick ........... H01L 27/14609 |
| | | 257/292 |
| 2012/0238051 A1* | 9/2012 | Park ................... H01L 27/1464 |
| | | 438/73 |
| 2013/0093911 A1 | 4/2013 | Sul et al. |

* cited by examiner

IMAGE SENSOR HAVING DIFFERENT SUBSTRATE BIAS VOLTAGES

CROSS-REFERENCE TO RELATED APPLICATION

This application claims the benefit of Korean Patent Application No. 10-2015-0026749, filed on Feb. 25, 2015, in the Korean Intellectual Property Office, the disclosure of which is incorporated herein in its entirety by reference.

BACKGROUND

Example embodiments of the inventive concepts relate to an image sensor. For example, at least some example embodiments relate to an image sensor having different substrate bias voltages to reduce (or, alternatively to prevent) a blooming effect.

Image sensors are semiconductor devices configured to convert optical images into electrical image data. Among semiconductor-based image sensors, complementary metal oxide semiconductor (CMOS) image sensor is characterized by increasing a degree of integration and a resolution of a pixel, thereby providing a display screen with improved image quality. CMOS image sensor converts an optical signal into an electrical signal by using a photoelectric device, such as a photodiode, and outputs the electrical signal. The photodiode is a device that generates photocharges in proportion to the amount of light applied thereto. When light that is too strong is applied to the photodiode, photocharges exceeding a storage capacity of the photodiode may be generated. The excessive photocharges may flow over not only a corresponding pixel but also adjacent pixels, which may lead to a generation of a screen that is white overall or is not precisely recognizable. When CMOS image sensor is used, a blooming effect causing such a screen distortion may occur.

SUMMARY

Example embodiments of inventive concepts relate to an image sensor configured to reduce a blooming effect by increasing a capacity of a photodiode to store photocharges based on different substrate bias voltages.

Example embodiments of inventive concepts also relate to an image processing device including an image sensor having different bias voltages.

According to example embodiment of the inventive concepts, an image sensor may include a plurality of pixels on a first region of a semiconductor substrate, the plurality of pixels configured to output pixel signals based on a received optical signal, and logic circuits on a second region of the semiconductor substrate, the second region being a different region from the first region, the logic circuits configured to output the pixel signals as image data, wherein, the first region is substrate biased to a first voltage and the second region is substrate biased to a second voltage different from the first voltage.

According to another example embodiments of the inventive concepts, an image processing device may include a digital signal processor configured to process image data; and an image sensor configured to output the image data, the image sensor including, a plurality of pixels formed on a first region of a semiconductor substrate, the plurality of pixels configured to output pixel signals based on a received optical signal, and logic circuits on a second region of the semiconductor substrate, the second region being a different region from the first region, the logic circuits configured to output the pixel signals as the image data, the second region being substrate biased to a second voltage different from the first.

According to example embodiments, an image sensor may include a semiconductor substrate. The semiconductor substrate may include a first region having one or more pixels connected to a first electrical path, the one or more pixels configured to accumulate photocharges to generate pixel signals based on a received incident light, and a second region having logic circuits connected to a second electrical path, the second electrical path being a different path from the first electrical path, the logic circuits configured to output the pixel signals as image data.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
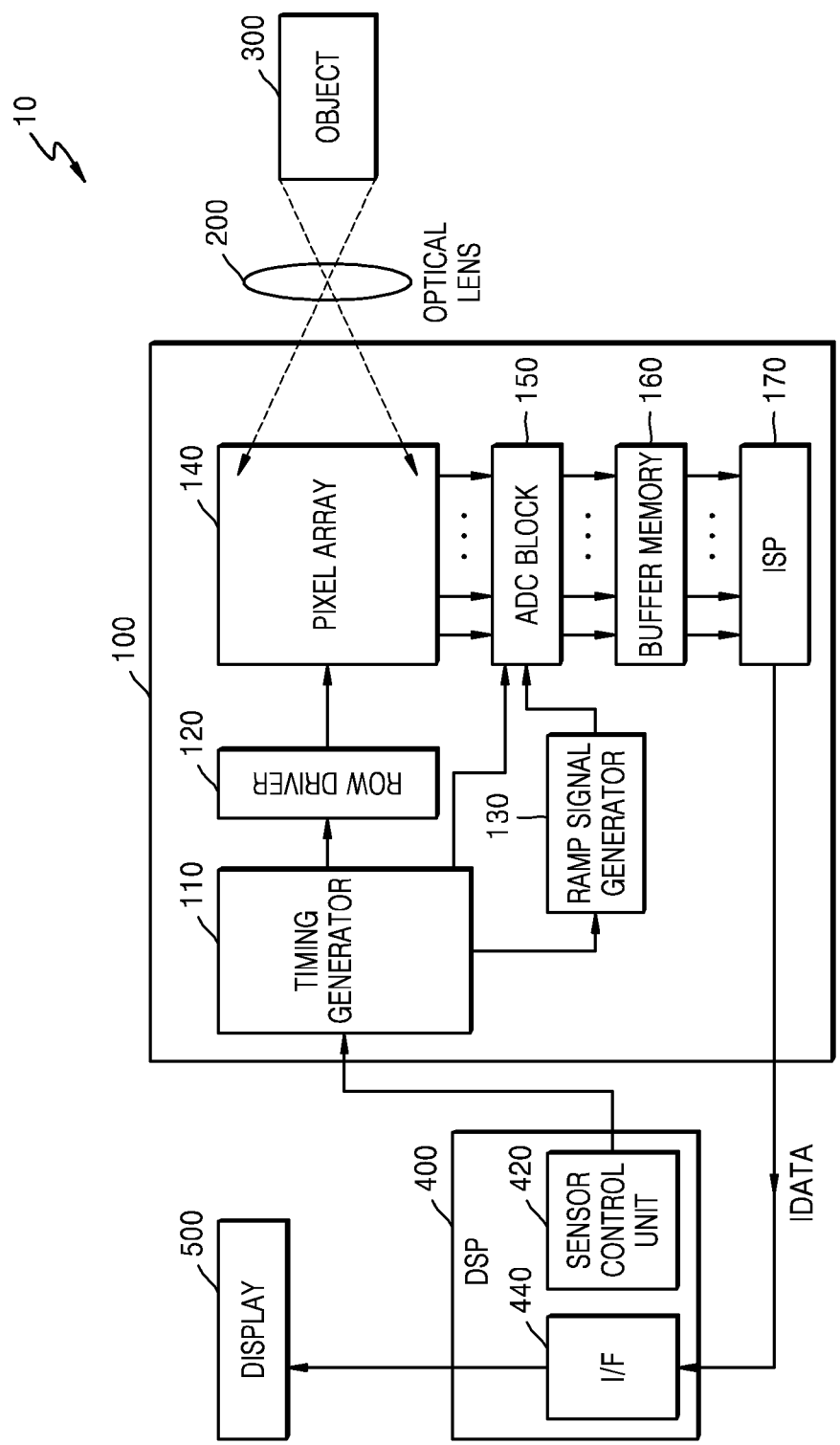
FIG. 1 is a block diagram of an image processing device including an image sensor according to example embodiments.

Hereinafter, example embodiments of the inventive concepts will now be described more fully with reference to the accompanying drawings, in which some example embodiments are shown. Like reference numerals in the drawings denote like elements, and a repeated explanation will not be given of overlapping features. Expressions such as "at least one of," when preceding a list of elements, modify the entire list of elements and do not modify the individual elements of the list. As used herein, the term "and/or" includes any and all combinations of one or more of the associated listed items. These example embodiments of the inventive concepts may, however, be embodied in different forms and should not be construed as limited to the example embodiments set forth herein. Rather, these example embodiments are provided so that this disclosure is thorough and complete and fully conveys the example embodiments of the inventive concepts to those skilled in the art. It should be understood that example embodiments of the inventive concepts are to cover all modifications, equivalents, and alternatives falling within the spirit and scope of the example embodiments of the inventive concepts. In the attached drawings, sizes of structures may be exaggerated for clarity.

The terminology used herein is for describing particular example embodiments and is not intended to be limiting thereof. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood by one of ordinary skill in the art to which the example embodiments belong. It will be further understood that the terms such as those defined in commonly used dictionaries should be interpreted as having meanings consistent with their meanings in the context of the relevant art and/or the present specification and will not be interpreted in an idealized or overly formal sense unless expressly so defined herein.

Semiconductor-based image sensors are mainly divided into a charge-coupled device (CCD) image sensor and a complementary metal oxide semiconductor (CMOS) image sensor. The CCD image sensor is used for an imaging application to obtain an image. The CCD image sensor may be produced in a large format of a small pixel size by using low noise charge domain processing techniques.

However, the CCD image sensor may suffer from many limitations. For example, the CCD image sensor may be susceptible to radiation damage, have high manufacturing costs, and need light shielding to reduce (or, alternatively prevent) image smear. The CCD image sensor may have a complicated driving method and a complicated manufacturing process, and great power consumption due to the large format arrangement. The use of the CCD image sensor for compact products may be limited, since a control circuit, a signal processing circuit, an analog-to-digital converter (ADC) circuit, etc. are not easily integrated on a CCD chip.

Due to such limitations of CCD technologies, interest in CMOS image sensor has been increasing. CMOS image sensor may have a relatively low voltage operation and low power consumption. Since CMOS image sensor is compatible with integrated on-chip electronic circuits, such as timing and control logics, image processing circuits, and ADC circuits, and may use the standard CMOS process technologies, CMOS image sensor may have a low manufacturing cost. Accordingly, the CMOS image sensor may not only reduce a size and an expense of a system, but may also perform a signal conditioning function by using a potential of the on-chip integrated circuit.

According to example embodiments of the inventive concepts, a CMOS image sensor may reduce (or, alternatively prevent) a blooming effect by using a potential based on different substrate bias voltages of the on-chip integrated circuit.

FIG. 1 is a block diagram of an image processing device 10 including an image sensor 100 according to example embodiments.

Referring to FIG. 1, the image processing device 10 may include the image sensor 100, an optical lens 200, a digital signal processor (DSP) 400, and a display unit 500. The image sensor 100 may generate image data IDATA of an object 300 based on light λ incident through the optical lens 200. The image sensor 100 may be realized as CMOS image sensor.

The image sensor 100 may include a timing generator 110, a row driver 120, a ramp signal generator 130, a pixel array 140, an analog-to-digital converter (ADC) block 150, a buffer memory 160, and an image signal processor (ISP) 170.

The timing generator 110 may generate control signals for controlling an operation timing of the image sensor 100. The timing generator 110 may be controlled by the DSP 400 connected to the image sensor 100. The DSP 400 may control the image sensor 100 to capture and process images. The DSP 400 may transfer the image data IDATA generated by the image sensor 100 to the display unit 500 via an interface 440 so that the image data IDATA is displayed. The display unit 500 may include computers, cellular phones, and/or other image output terminals. The display unit 500 may be realized as a thin film transistor-liquid crystal display (TFT-LCD), a light-emitting diode (LED) display, an organic LED (OLED) display, and/or an active-matrix OLED (AMOLED) display.

The timing generator 110 may be controlled by a sensor control unit 420 of the DSP 400. The sensor control unit 420 may generate timing control signals for controlling the timing operation of the image sensor 100 and provide the generated timing control signals to the timing generator 110. The timing generator 110 may control operations of the row driver 120, the ramp signal generator 130, and the ADC block 150 based on the timing control signals. According to example embodiments, the sensor control unit 420 may perform camera control operations such as automatic focusing, automatic exposure, and lens transferring according to optical zooms for taking photos.

The row driver 120 may drive at least one of a plurality of row lines of the pixel array 140 based on the timing operation control of the timing generator 110. The row driver 120 may generate photo gate signals for controlling output timing per row line and provide the generated photo gate signals to the pixel array 140. The photo gate signals may include a transfer control signal, a reset control signal, and a selection signal which drive pixels of the pixel array 140.

The ramp signal generator 130 may generate a ramp signal based on a control of the timing generator 110. For example, the ramp signal generator 130 may change a voltage level of the ramp signal as a current flow changes in time, by using a digital-to-analog converter (DAC) or a voltage-current converter (V-I Converter) that uses a current. The ramp signal is generated as a voltage having a single slope, and may be provided to the ADC block 150 to be compared with a pixel signal output from the pixel array 140.

The pixel array 140 may include a plurality of pixels arranged in rows and columns. The pixels perform a function of a photoelectric conversion device which converts light into electrical signals. The pixels connected between row lines and column lines may be realized as a unit pixel, which will be described later with reference to FIGS. 3 and 10 through 12. The pixels may include a photodiode and transistors.

In the pixel array 140, a semiconductor substrate, on which the pixels are formed, may be biased to a negative (−) voltage. The photodiode of the pixels may be formed of a first electrode and a second electrode. The first electrode may be formed of a first impurity area having a first conductive type impurity and the second electrode may be formed of a second impurity area having a second conductive type impurity, and the second impurity area may surround the first impurity area. The second impurity area of the photodiode is formed of the same material as the semiconductor substrate, and thus, the negative (−) voltage may be applied to the second impurity area to increase a full-well-capacitance (FWC) of the photodiode. The increase in the FWC of the photodiode may obtain (or, alternatively secure) a blooming margin of the pixel and reduce (or, alternatively to prevent) a blooming effect.

The ADC block 150 converts an analog pixel signal output from the pixel array 140 into a digital pixel signal. The ADC block 150 may apply a correlated double sampling (CDS) method to perform a correlated double sampling operation on the pixel signal output from each of the column lines of the pixel array 140. Each of the pixel signals may be applied as an input to a first terminal of ADC block 150. Further, the ramp signal may be applied as an input to a second terminal thereof. The ADC block 150 may compare each of the pixel signals, on which the correlated double sampling is performed, with the ramp signal output from the ramp signal generator 130 to output comparison signals. The ADC block 150 may count the comparison signals based on a count clock signal and output the counted comparison signals as the digital pixel signal.

According to example embodiments, a structure of the ADC block 150 may be changed according to an application of the CDS method, such as an analog CDS method, a digital CDS method, or a dual CDS method. Also, the ADC block 150 may be realized as a column ADC, which is arranged per column line of the pixel array 140 or as a single ADC.

The buffer memory 160 may be a volatile memory device, for example, a static random access memory (SRAM), a dynamic random access memory (DRAM), etc.

The buffer memory 160 may store the digital pixel signals that are output from the ADC block 150 in a frame unit. The buffer memory 160 may be referred to as a frame memory.

The ISP 170 may output the image data IDATA by performing a signal processing on the digital pixel signal stored in the buffer memory 160. The signal process may include operations such as color interpolation, color correction, auto white balance, gamma correction, color saturation correction, format correction, bad pixel correction, hue correction, etc.

In the example embodiments, the ISP 170 may be included in the image sensor 100, thereby forming one package, but are not limited thereto. For example, the ISP 170 may also be included in the DSP 400. Also, according to example embodiments, the image sensor 100 and the DSP 400 may be realized as a multi-chip package.

The image signal processor 170 and the digital signal processor 400 may include a processor and a memory (not shown).

The memory may be a nonvolatile memory device, for example, a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on. The image signal processor 170 and the digital signal processor 400 may be an application-specific-integrated-circuit (ASIC), a field programmable gate array (FPGA), or a similar device.

The memory may contain computer readable code that, when executed by the processor, configures the processor as a special purpose computer. For example, the code may configure the image signal processor 170 as a special purpose computer to perform image processing on the digital pixel signal from the buffer memory 160. The code may also configure the DSP 400 as a special purpose computer to control the image sensor 100 to capture and process images.

Figure 2:
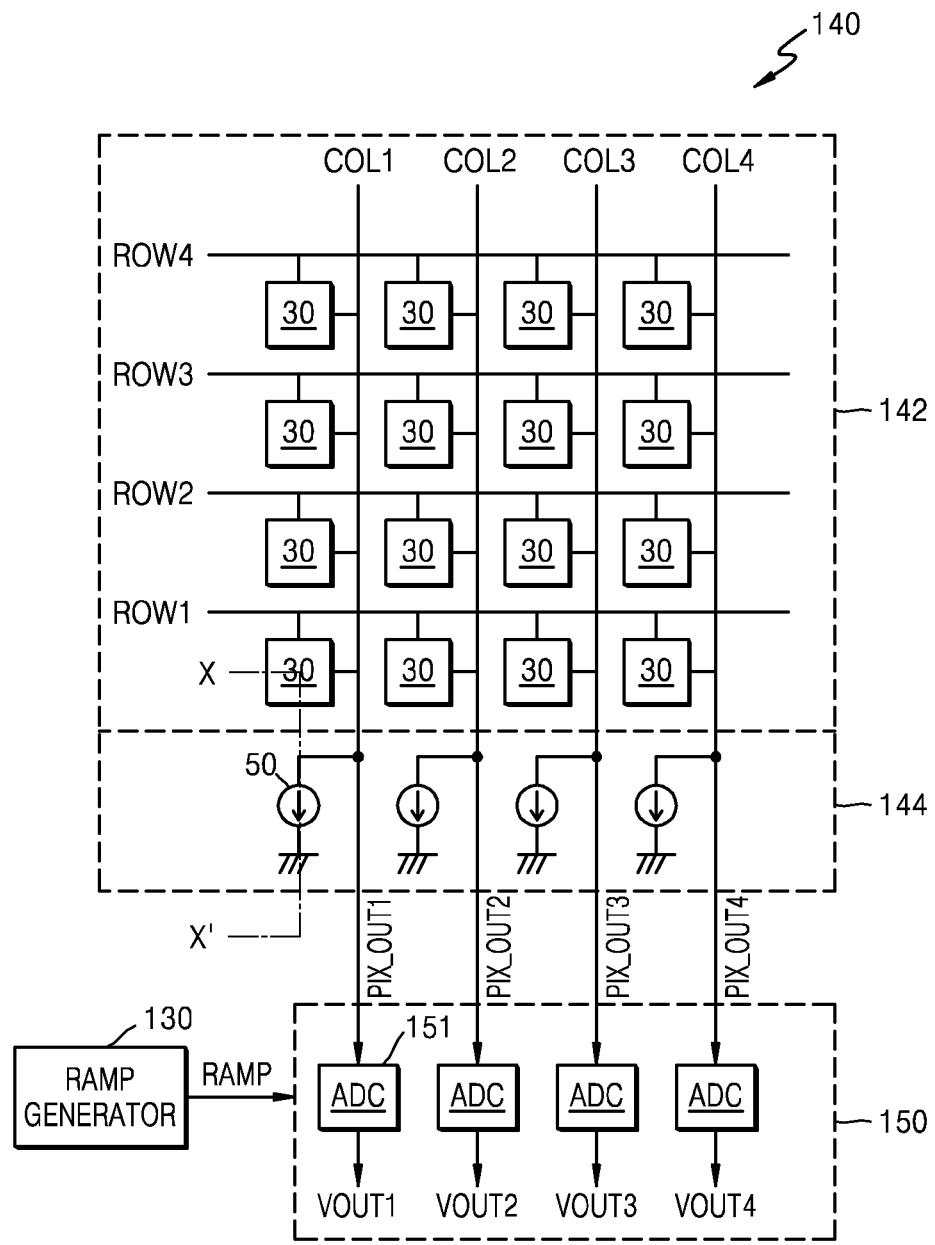
FIG. 2 is a block diagram of a portion of a pixel array of FIG. 1.

FIG. 2 is a block diagram of a portion of the pixel array 140 of FIG. 1. The pixel array 140 may include pixels connected to row lines and column lines that could be substantially hundreds, thousands, or more. For example, in the example embodiments, pixels 30 arranged in a 4×4 matrix are illustrated.

Referring to FIG. 2, the pixel array 140 may be divided into a first region 142, in which the pixels 30 are formed, and a second region 144, in which bias current sources 50 are formed. A substrate bias of the first region 142 may be biased to a first voltage $V_{NEG}$ and a substrate bias of the second region 144 may be biased to a second voltage $V_{GND}$ different from the first voltage $V_{NEG}$. For example, the first voltage $V_{NEG}$ may be set as a negative (−) voltage, and the second voltage $V_{GND}$ may be set as a ground voltage VSS. The first region 142 of the pixel array 140, in which the pixels 30 are formed, may be biased to the negative first voltage $V_{NEG}$ to significantly increase a photocharge capacity of the pixels 30.

The first region 142 of the pixel array 140 may include the plurality of pixels 30 connected to the row lines ROW1 to ROW4 and the column lines COL1 to COL4. The pixels 30 may include a photoelectric device, such as a photodiode or a pinned photodiode. The pixels 30 may sense light by using the photodiode and convert the sensed light into an electrical signal to output pixel signals PIX_OUT1 to PIX_OUT4.

The pixels 30 may be realized as various structures according to the number of transistors which form the pixels 30 together with a photodiode. For example, the pixels 30 may be realized as a 3-transistor (3-T) pixel structure, a 4-transistor (4-T) pixel structure, or a 5-transistor (5-T) pixel structure. For example, when the pixels 30 are realized as the 4-T pixel structure, the pixels 30 may include the photodiode, a transfer transistor, a reset transistor, a drive transistor, and a select transistor.

The transfer control signal, the reset control signal, and the select signal may be provided to the row lines ROW1 to ROW4 of the pixel array 140 from the row driver 120 of FIG. 1 to drive the transistors of the pixels 30.

The bias current sources 50 may be connected to the column lines COL1 to COL4 to which the pixels 30 are connected. The bias current sources 50 may operate as an active load of the column lines COL1 to COL4. The second region 144 of the pixel array 140, in which the bias current sources 50 are formed, may be arranged adjacent to the first region 142 of the pixel array 140, in which the pixels 30 are formed.

The bias current source 50 may convert a current output via the column lines COL1 to COL4 in the pixels 30 connected to a selected row line, for example, the first row line ROW1, into a voltage, and may output the voltage as the pixel signals PIX_OUT1 to PIX_OUT4. The pixel signals PIX_OUT1 to PIX_OUT4 may include a reset signal and an image signal based on an operation of the transistors of the pixels 30.

Each of the pixel signals PIX_OUT1 to PIX_OUT4 output in the pixel array 140 may be provided to an ADC 151 of the ADC block 150. The ADC 151 may compare corresponding pixel signals PIX_OUT1 to PIX_OUT4 with a ramp signal RAMP generated by the ramp signal generator 130 and output output signals VOUT1 to VOUT4 as compared results. The output signals VOUT1 to VOUT4 may correspond to a difference between the image signal and the reset signal, which varies based on illumination of external light, and the difference between the image signal and the reset signal may be output based on a slope of the ramp signal RAMP. The output signals VOUT1 to VOUT4 may be counted based on the count clock signal and output as the digital pixel signals.

Figure 3:
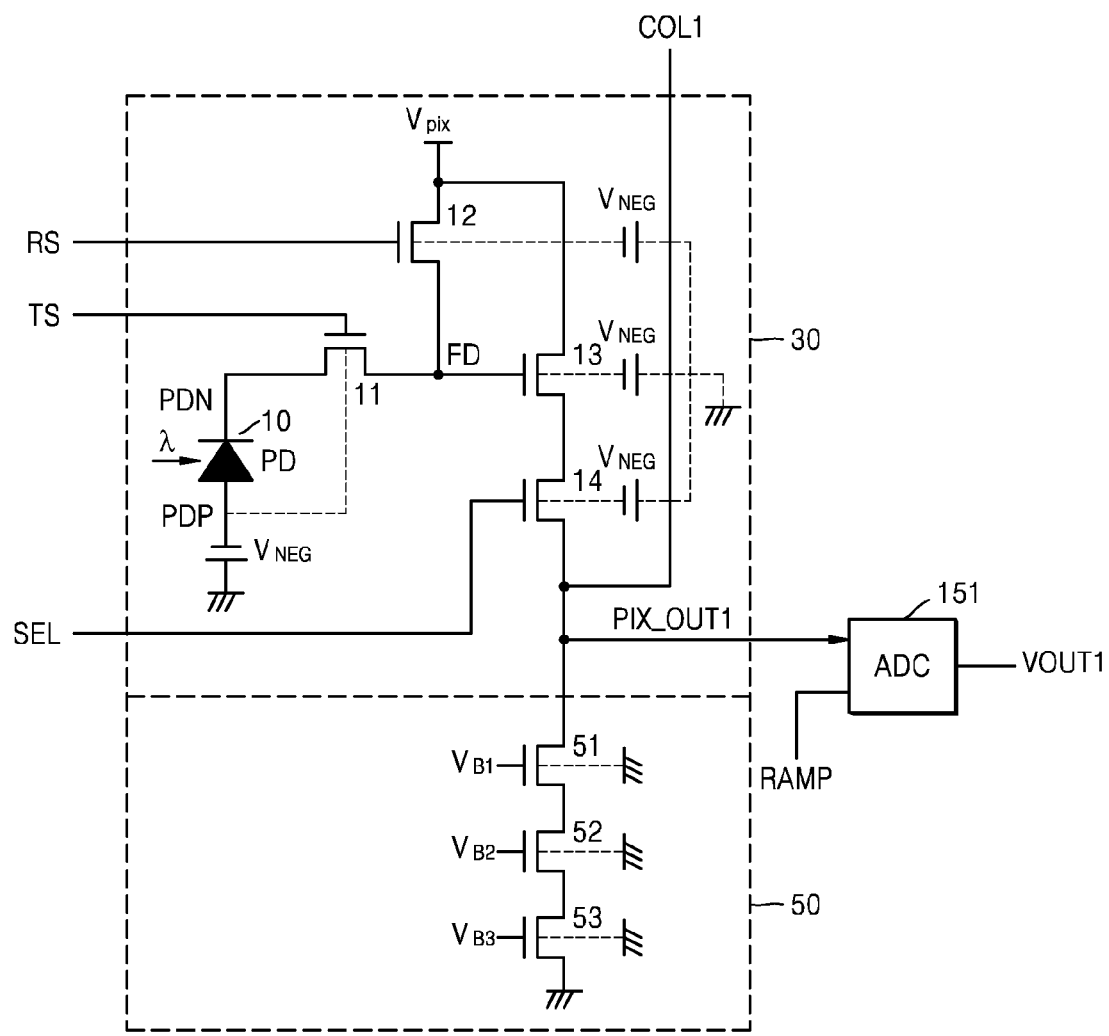
FIG. 3 is a circuit diagram of a pixel and a bias current source of FIG. 2.
Figure 4:
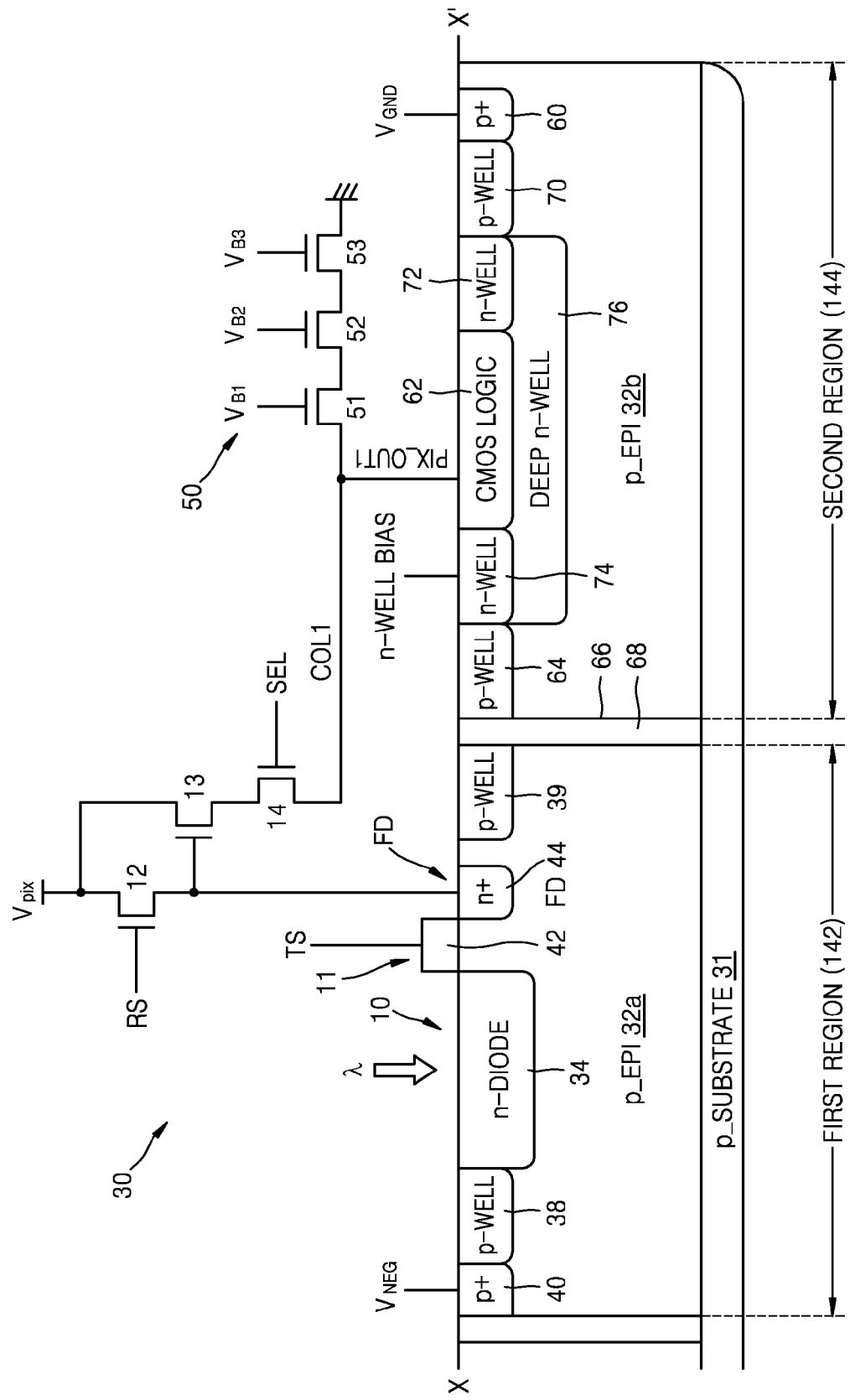
FIG. 4 is a cross-sectional view of a unit pixel and a bias current source forming an image sensor according to example embodiments, and illustrates a cross-sectional view taken along a line X-X' of the pixel array of FIG. 2.
Figure 5:
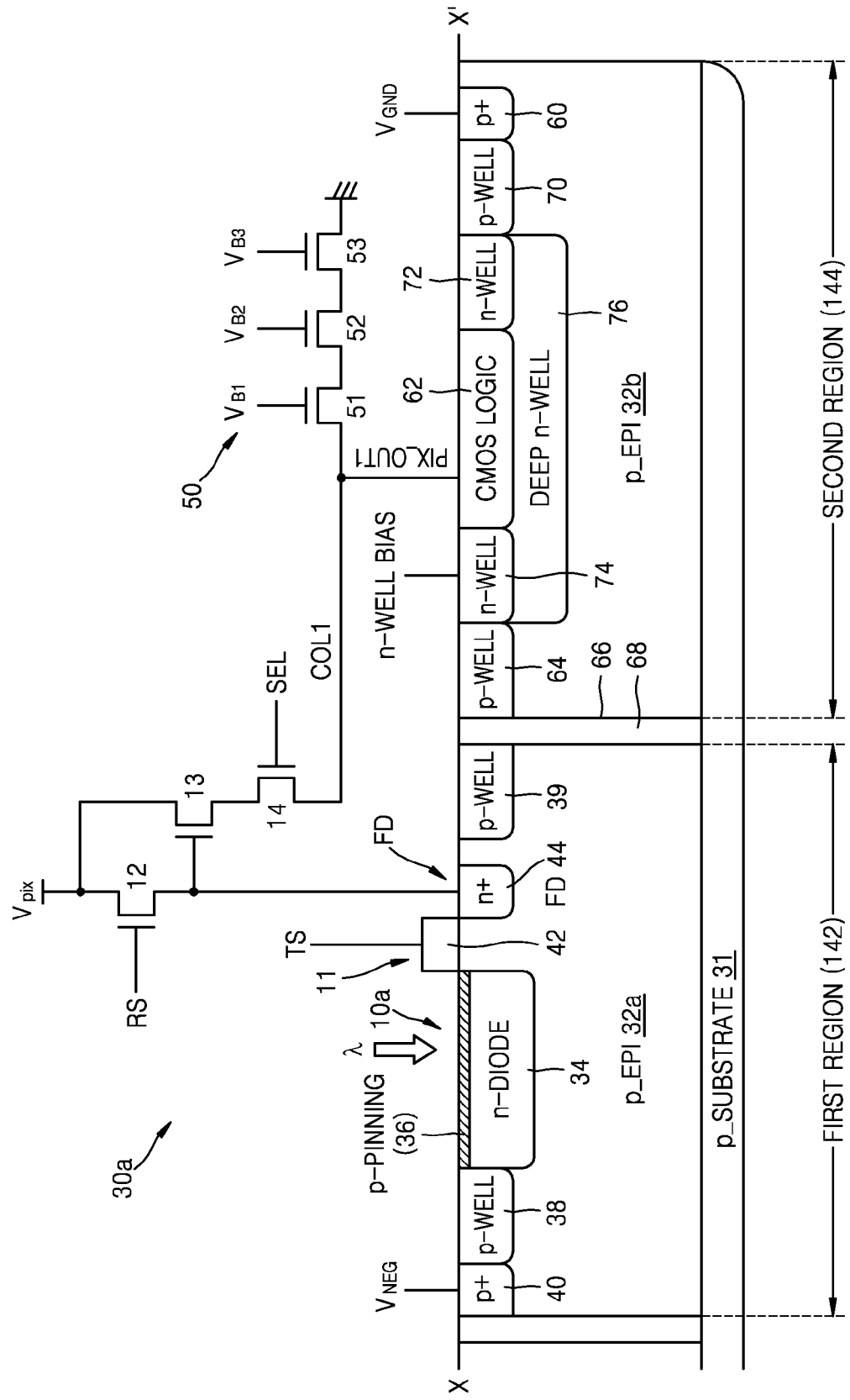
FIG. 5 illustrates another example of the cross-sectional view taken along the line X-X' of the pixel array of FIG. 2.

FIGS. 3 through 5 are views for describing the pixel 30 of FIG. 2 and a detection of the pixel signals PIX_OUT1 to PIX_OUT4. FIG. 3 is a circuit diagram of the pixel 30 and the bias current source 50 of FIG. 2, and FIGS. 4 and 5 are cross-sectional views of the pixel 30 and the bias current source 50 taken along a line X-X' of FIG. 2.

Referring to FIG. 3, the pixel 30 may be formed as the 4-transistor (4-T) pixel. The pixel 30 may include a photodiode 10, a transfer transistor 11, a reset transistor 12, a drive transistor 13, and a select transistor 14.

The photodiode 10 performs photoelectric conversion which generates a photocharge based on incident light λ. The photodiode 10 may be connected between a first node PDP and a second node PDN, a first voltage $V_{NEG}$, which is a negative (−) voltage, is applied to the first node PDP, and the second node PDN may be connected to the transfer transistor 11. The first node PDP may be realized as a p-type impurity-doped area and the second node PDN may be realized as an n-type impurity-doped area. The photodiode 10 may accumulate and output the photocharge generated based on the incident light λ. According to example embodiments, the photodiode 10 may be realized as a pinned photodiode.

The transfer transistor 11 may transfer the photocharge accumulated in the photodiode 10 to a floating sensing node FD. The transfer transistor 11 includes a transfer gate TG. Portions of the photodiode 10 and the floating sensing node FD may be formed as source/drain coupling of the transfer transistor 11. The transfer transistor 11 is controlled by a transfer control signal TS applied to the transfer gate TG. A substrate bias of the transfer transistor 11 may be biased to the first voltage $V_{NEG}$, which is a negative (−) voltage.

The reset transistor 12 may be connected to the floating sensing node FD. For example, the floating sensing node FD may be a drain of the reset transistor 12. A source of the reset transistor 12 may be connected to a power voltage Vpix. The reset transistor 12 may reset the floating sensing node FD as a voltage level of the power voltage Vpix, based on a reset control signal RS applied to a gate of the reset transistor 12. A substrate bias of the reset transistor 12 is biased to the first voltage $V_{NEG}$, which is the negative (−) voltage.

The drive transistor 13 and the select transistor 14 may be connected between the power voltage Vpix and the column line COL1. For example, a source of the drive transistor 13 may be connected to the power voltage Vpix, a drain of the drive transistor 13 may be connected to a source of the select transistor 14, and a drain of the select transistor 14 may be connected to the column line COL1. The drive transistor 13 generates a current between the source and the drain in proportion to the photocharge transferred to the floating sensing node FD. A substrate bias of the drive transistor 13 may be biased to the first voltage $V_{NEG}$, which is a negative (−) voltage.

The select transistor 14 may output a current generated by the drive transistor 13 via the column line COL1 based on a select signal SEL applied to a gate of the select transistor 14. The plurality of pixels may be connected to the column line COL1. By selectively applying the select signal SEL to the gate of the select transistor 14, pixels connected to other pixel rows may be connected to the column line COL1. The select signal SEL may be row address signals, which are decoded. A substrate bias of the select transistor 14 may be biased to the first voltage $V_{NEG}$, which is a negative (−) voltage.

The bias current source 50 may convert the current output from the select transistor 14 of the pixel 30 via the column line COL1 into a voltage. The bias current source 50 may include transistors 51, 52, and 53 connected in series between the column line COL1 and a ground voltage. The transistors 51, 52, and 53 may be controlled by first through third bias voltages $V_{B1}$ to $V_{B3}$, respectively, and an offset of the pixel signal PIX_OUT may be adjusted by the first through third bias voltages $V_{B1}$ to $V_{B3}$, respectively. A substrate bias of the transistors 51, 52, and 53 of the bias current source 50 is biased to a second voltage $V_{GND}$, which is a ground voltage VSS.

In the example embodiments, the bias current source 50 is formed of the three transistors 51, 52, and 53, which are connected in series, but example embodiments are not limited thereto. For example, in some embodiments, the bias current source 50 may include one or more transistors connected between the column line COL1 and the ground voltage. In other embodiments, the bias current source 50 may include a plurality of transistors connected in parallel between the column line COL1 and the ground voltage VSS.

The pixels 30 may generate the pixel signal PIX_OUT1 based on incident light λ. The photodiode 10 may generate the photocharge based on an intensity of the incident light λ. The transfer transistor 11 may transfer the photocharge generated in the photodiode 10 to the floating sensing node FD, when the transfer control signal TS output in the row driver 120 of FIG. 1 is applied at a logic high level to the gate of the transfer transistor 11 based on a control of the timing generator 110 of FIG. 1.

The drive transistor 13 may generate a sensing current based on a potential due to the photocharge transferred to the floating sensing node FD. When the select signal SEL output in the row driver 120 of FIG. 1 is applied at a logic high level to the gate of the select transistor 14, the select transistor 14 may provide the sensing current to the bias current source 50. The bias current source 50 may convert the sensing current into a voltage to output the image signal as the pixel signal PIX_OUT1 in the ADC 151.

When the reset control signal RS output in the row driver 120 of FIG. 1 is applied at a logic high level to the gate of the reset transistor 12, the reset transistor 12 may reset the floating sensing node FD to the power voltage Vpix. The drive transistor 13 may generate a reset current based on the power voltage Vpix of the floating sensing node FD. When the select signal SEL output in the row driver 120 of FIG. 1 is applied at the logic high level to the gate of the select transistor 14, the select transistor 14 may provide the reset current to the bias current source 50. The bias current source

50 may convert the reset current into a voltage to output a reset signal as the pixel signal PIX_OUT1 in the ADC 151.

The ADC 151 may perform the correlated double sampling operation on the image signal and the reset signal, which are the pixel signal PIX_OUT1 output from the pixel 30, and may output a difference between the image signal and the reset signal as an output signal VOUT1 based on a slope of the ramp signal RAMP.

FIG. 4 is a cross-sectional view of the pixel array 140 of FIG. 2 taken along a line X-X' and illustrates a unit pixel 30 and the bias current source 50 forming an image sensor according to example embodiments. The unit pixel 30 may be formed as the 4-T pixel 30 of FIG. 3.

Referring to FIG. 4, the 4-T pixel 30 of the first region 142 of the pixel array 140 may include the photodiode 10 and four NMOS transistors, namely, the transfer transistor 11, the reset transistor 12, the drive transistor 13, and the select transistor 14.

The photodiode 10 may include an n-impurity-doped area 34 formed in a p-epitaxial layer 32a. The n-impurity-doped area 34 and the p-epitaxial layer 32a form a depletion area. P-wells 38 and 39 formed in the p-epitaxial layer 32a and adjacent to the photodiode 10 separate the 4-T pixel 30 from adjacent pixels.

The p-well 38 may be formed adjacent to a p+ contact area 40. The first voltage $V_{NEG}$ may be applied to a first electrical path between the p+ contact area 40 and the p-epitaxial layer 32a such that the p+ contact area 40 provides a substrate bias voltage to the p-epitaxial layer 32a. The first voltage $V_{NEG}$ is a negative (−) voltage and causes a low potential in the p-epitaxial layer 32a. The negative (−) voltage $V_{NEG}$ of the p+ contact area 40 provides a substrate bias voltage of the 4-T pixel 30.

The transfer transistor 11 has a transfer gate 42 connected between the photodiode 10 and the reset transistor 12. The floating sensing node FD is formed between the transfer gate TG and the reset transistor 12, and may be formed as an n+ impurity area 44 of the transfer transistor 11. The floating sensing node FD may be separated from the photodiode 10. The photocharge generated in the photodiode 10 may be transferred to the floating sensing node FD, when the transfer control signal TS of "logic high" is applied to the transfer gate 42.

The photocharge accumulated in the photodiode 10 is transferred to the floating sensing node FD via the transfer transistor 11, and the drive transistor 13 generates a current using the photocharge of the floating sensing node FD. The current of the drive transistor 13 may be transferred to the column line COL1 via the select transistor 14 based on a select signal SEL. Here, the current transferred to the column line COL1 may be referred to as a sensing current.

The reset transistor 12 may be electrically connected to the floating sensing node FD. The floating sensing node FD may be reset to a power voltage Vpix when a reset control signal RS of "logic high" is applied to a gate of the reset transistor 12. The drive transistor 13 may generate the current using the power voltage Vpix of the floating sensing node FD.

The reset current and the sensing current transferred to the column line COL1 via the select transistor 14 may be converted into a voltage by the transistors 51, 52, and 53 of the bias current source 50 and may be output as the reset signal and the image signal. For example, the reset signal and the image signal may be output as the pixel signal PIX_OUT1 via the column line COL1 and may be provided to the ADC 151 of FIG. 3 connected to the column line COL1 to be converted into the digital pixel signal.

The photodiode 10 and the four NMOS transistors, namely, the transfer transistor 11, the reset transistor 12, the drive transistor 13, and the select transistor 14, of the pixel 30 may be formed in the first region 142 in which the first voltage $V_{NEG}$, which is a negative (−) voltage, is biased to a substrate bias. The transistors 51, 52, and 53 of the bias current source 50 and the ADC 151 may be formed in the second region 144 of the pixel array 140, in which the second voltage $V_{GND}$, which is the ground voltage VSS, is biased to a substrate bias.

The second region 144 of the pixel array 140, in which the bias current source 50 is formed, may include a p+ contact area 60 and a CMOS logic area 62 on the p-epitaxial layer 32b. The second voltage $V_{GND}$ may be applied to a second electrical path between the p+ contact area 60 and the p-epitaxial layer 32b such that the p+ contact area 60 may provide a substrate bias voltage $V_{GND}$ to the p-epitaxial layer 32b.

The CMOS logic area 62 is an area in which circuits operating in correspondence to the pixel 30 of the first region 142 are formed. For example, the transistors 51, 52, and 53 of the bias current source 50 may be formed in the CMOS logic area 62. The CMOS logic area 62 may include the timing generator 110, the row driver 120, the ramp generator 130, the ADC block 140, and the buffer memory 160 that are described with reference to FIG. 1. According to some example embodiments, the ISP 170 may also be included in the CMOS logic area 62.

The CMOS logic area 62 may be separated from the pixel 30 by a separation layer 68 adjacent to a p-well 64. The separation layer 68 may be formed by a process of burying a trench 66 penetrating the p-epitaxial layers 32a and 32b formed on the semiconductor substrate 31 with an insulating material. A p-well 70 separates n-wells 72 and 74 adjacent to the p+ contact area 60 and the CMOS logic area 62. An n-well bias may be applied to the n-well 74 to provide a contact for biasing a deep n-well 76.

FIG. 5 illustrates another example of the cross-sectional view taken along the line X-X' of the pixel array 140 of FIG. 2.

Referring to FIG. 5, FIG. 5 differs from FIG. 4 in that a photodiode 10a of a pixel 30a includes the n-impurity-doped area 34 formed in the p-epitaxial layer 32a and a p-type pinning layer 36 formed on the n-impurity-doped area 34. In FIG. 5, components other than the pinned photodiode 10a are the same as the components described with reference to FIG. 4.

The pinned photodiode 10a refers to a diode having a state in which the diode has a constant potential charge since all mobile charges in the photodiode are completely depleted. In the pinned photodiode 10a, the potential of the photodiode may be pinned as a constant value irrespective of external bias environments, such as a potential of the floating sensing node FD. Accordingly, the pinned photodiode 10a may reduce (or, alternatively prevent) a noise element, such as dark current.

Figure 6:
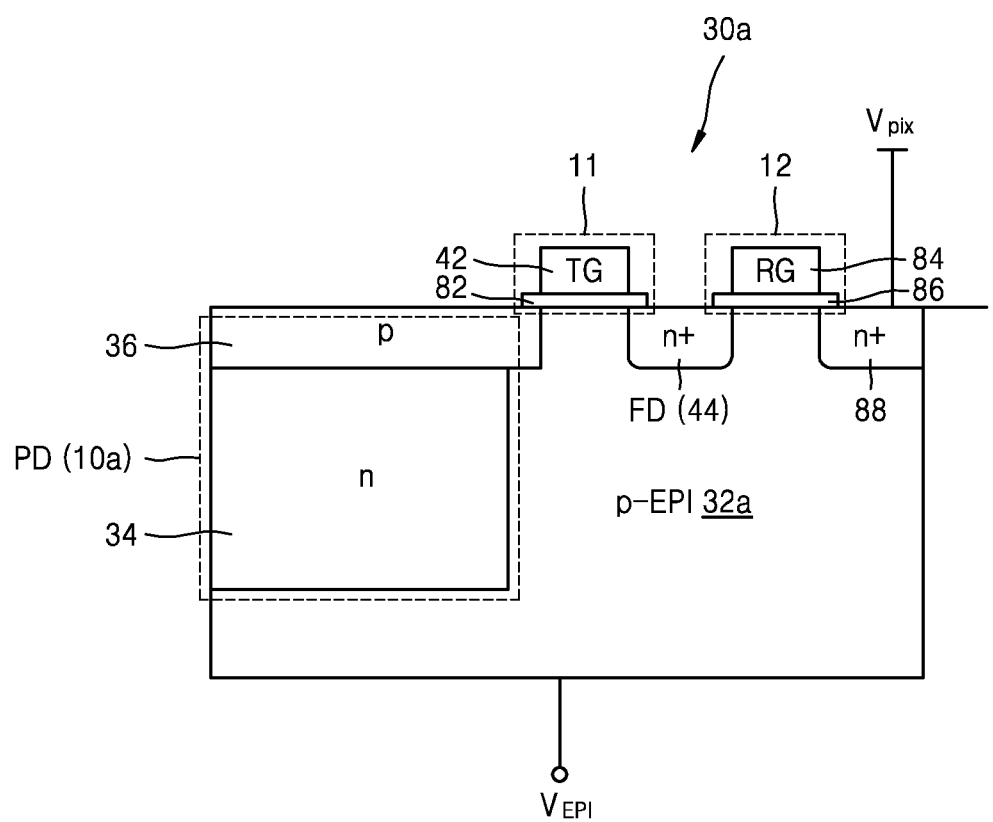
FIGS. 6 and 7 are a cross-sectional view and a corresponding circuit diagram, respectively, of an area of a pixel of FIG. 5.
Figure 7:
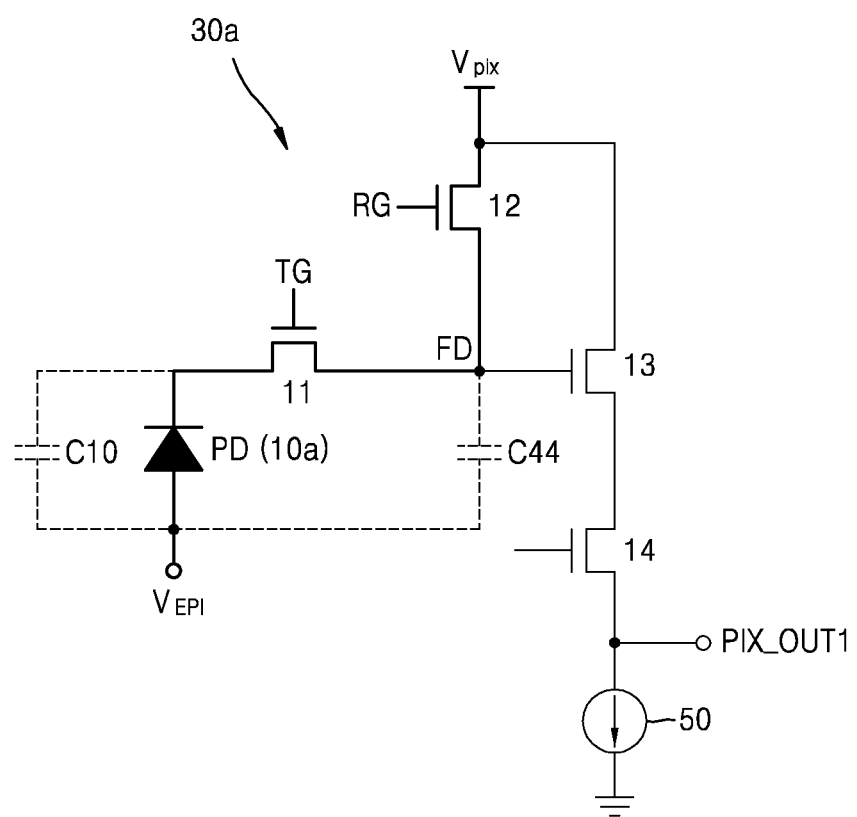

FIGS. 6 and 7 are a cross-sectional view and a corresponding circuit diagram of a pixel, respectively, illustrating the pinned photodiode 10a of the pixel 30a of FIG. 5 and areas of the transfer transistor 11 and the reset transistor 12. Hereafter, the pinned photodiode 10a will be referred to as a photodiode PD.

Referring to FIG. 6, the photodiode PD may be formed of the n-impurity area 34 and a surface p-impurity area 36 on the p-epitaxial layer 32a. The transfer transistor 11 may contact the photodiode PD and formed of the transfer gate 42, a gate oxide layer 82, the p-epitaxial layer 32a, and the n+ impurity area 44. The n+ impurity area 44 may act as the floating sensing node FD. The reset transistor 12 may contact the floating sensing node FD, and formed of a reset gate (RG) 84, a gate oxide layer 86, the p-epitaxial layer 32*a*, and an n+ impurity area 88. The p-epitaxial layer 32*a* may be biased to a substrate bias voltage $V_{EPI}$.

FIG. 7 is the circuit diagram corresponding to the cross-sectional view of the pixel 30*a* of FIG. 6, and is similar to the circuit diagram of the pixel 30 of FIG. 3. Compared with the circuit diagram of the pixel 30 of FIG. 3, FIG. 7 further illustrates a first capacitance C10 arranged in parallel with the photodiode PD and a second capacitance C44 existing in the floating sensing node FD. The first capacitance C10 is modelled on a diffusion capacitance of the n-impurity area 34 on the p-epitaxial layer 32*a* of FIG. 6, and the second capacitance C44 is modelled on a diffusion capacitance of the n+ impurity area 44 and a gate capacitance of the drive transistor 13.

The photodiode PD and the first capacitance C10 may form a light receiver for accumulating the photocharge generated based on the incident light. The transfer transistor 11 transfers the photocharge accumulated in the photodiode PD and the first capacitance C10 to the floating sensing node FD. The floating sensing node FD may be reset by the reset transistor 12 before receiving the photocharge. For example, the photocharge accumulated in the photodiode PD is transferred to the floating sensing node FD after the reset of the floating sensing node FD, and the photocharge transferred to the floating sensing node FD is sensed and output as a pixel signal PIX_OUT1.

The operations of accumulating the photocharge in the pixel 30*a* and sensing the amount of accumulated photocharge may be affected by the substrate bias voltage $V_{EPI}$ of the p-epitaxial layer 32*a* on which the photodiode PD is formed. Hereafter, the operation of the pixel 30*a* according to the substrate bias voltage $V_{EPI}$ will be described with reference to potential energy diagrams of FIGS. 8A through 8D.

In FIGS. 8A through 8D, the substrate bias voltage $V_{EPI}$ is biased to the second voltage $V_{GND}$, which is a ground voltage, and the power voltage Vpix may be set to have a voltage level of about 3.3V.

Figure 8A:
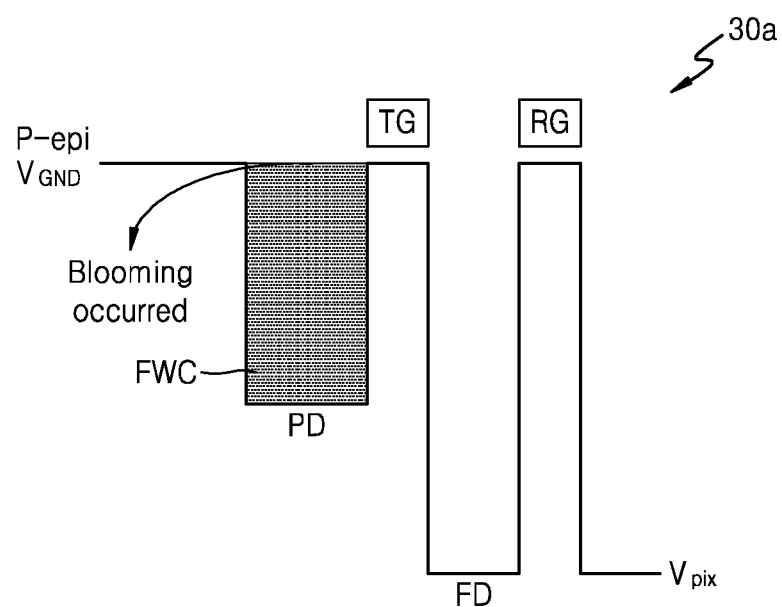
FIGS. 8A through 8D are diagrams of a potential energy of a pixel of FIG. 6 when a substrate bias voltage of the pixel is biased to a ground voltage.

In FIG. 8A, when too strong light is applied to the photodiode PD, photocharges, which exceed a storage capacity of the photodiode PD, may be generated. The storage capacity of the photodiode PD may correspond to the first capacitance C10 of FIG. 7. The first capacitance C10 may correspond to a full well capacitance (FWC) of the photodiode PD. The photocharges which exceed the FWC of the photodiode PD may flow over not only the pixel 30*a*, but also adjacent pixels. Here, a blooming effect generating a screen, which is white overall or is hardly recognizable, may occur.

Figure 8B:
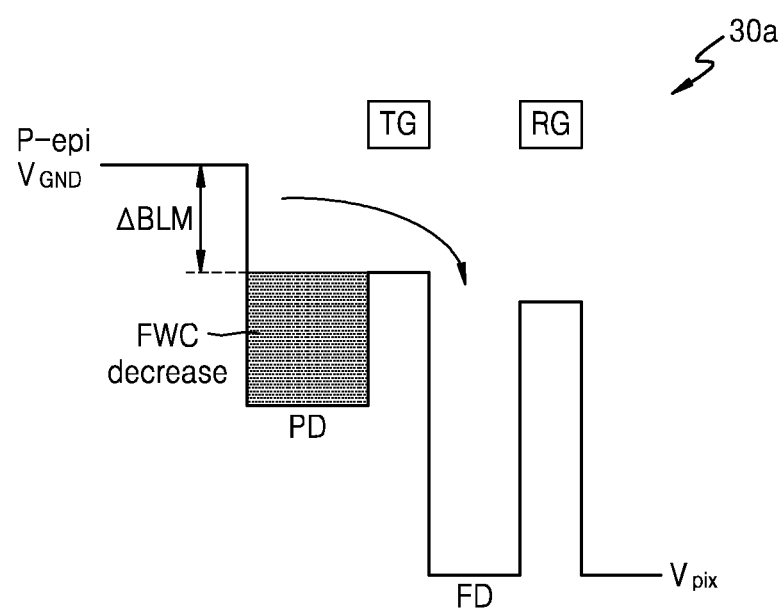

In FIG. 8B, a potential of the transfer gate TG may be reduced by increasing a voltage of the transfer gate TG and a potential of the reset gate RG may be reduced by increasing a voltage of the reset gate RG, so that the photocharge does not overflow the photodiode PD. The photodiode PD may obtain (or, alternatively secure) a blooming margin ΔBLM corresponding to the reduced potential of the transfer gate TG and the reset gate RG. However, the FWC of the photodiode PD may be reduced due to increase in the voltage of the transfer gate TG and the voltage of the reset gate RG.

Figure 8C:
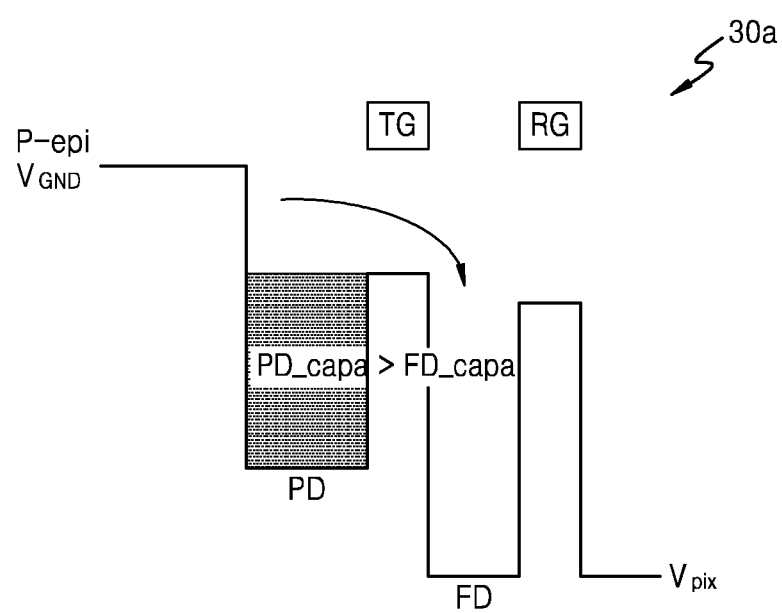

In FIG. 8C, to cope with the above phenomenon in FIG. 8B, the FWC of the photodiode PD may be increased by increasing a size of the photodiode PD. When the FWC of the photodiode PD is increased, a capacity PD_capa of the photodiode PD may become greater than a capacity FD_capa of the floating sensing node FD. Accordingly, charge sharing of the photocharge between the photodiode PD and the floating sensing node FD may occur and the charge transfer efficiency may deteriorate.

Figure 8D:
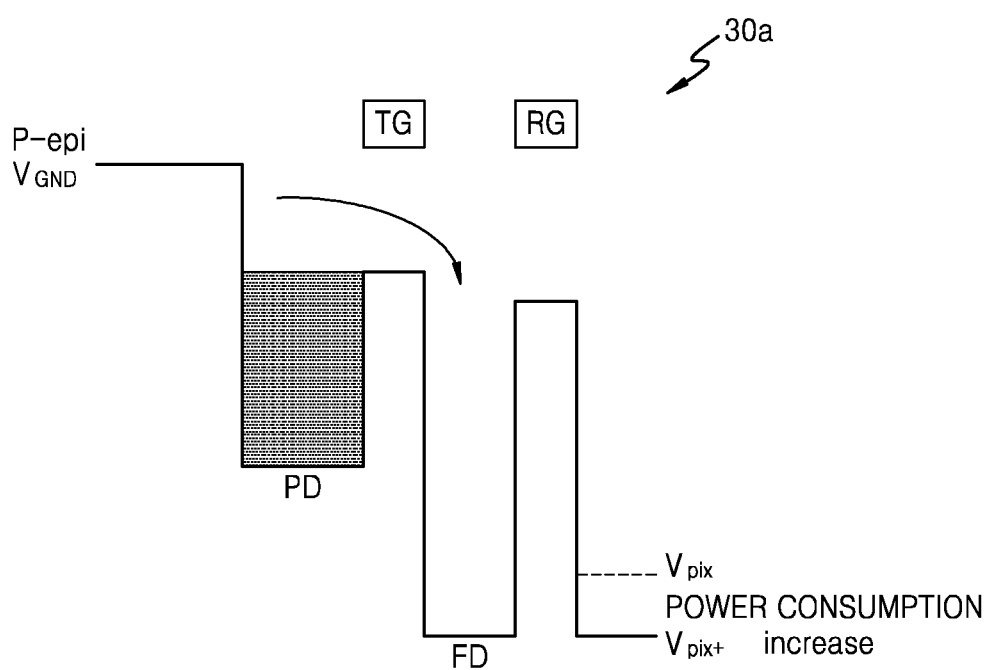

In FIG. 8D, the capacity FD_capa of the floating sensing node FD may be increased by using the power voltage Vpix in order to cope with the phenomenon raised in FIG. 8C. The floating sensing node FD may be reset to a power voltage Vpix+, which is higher than 3.3V, by increasing a level of the power voltage Vpix applied to the reset transistor 12. A potential of the floating sensing node FD may be decreased in correspondence to the increased power voltage Vpix+, so that the charge transfer efficiency to the floating sensing node FD from the photodiode PD may be improved. However, since the high power voltage Vpix+ is needed, power consumption may be increased.

In contrast, in one or more example embodiments, the blooming effect is reduced, whereby the phenomena raised in the methods of reducing (or, alternatively preventing) the blooming effect described above in FIGS. 8A through 8D are not generated.

Figure 9:
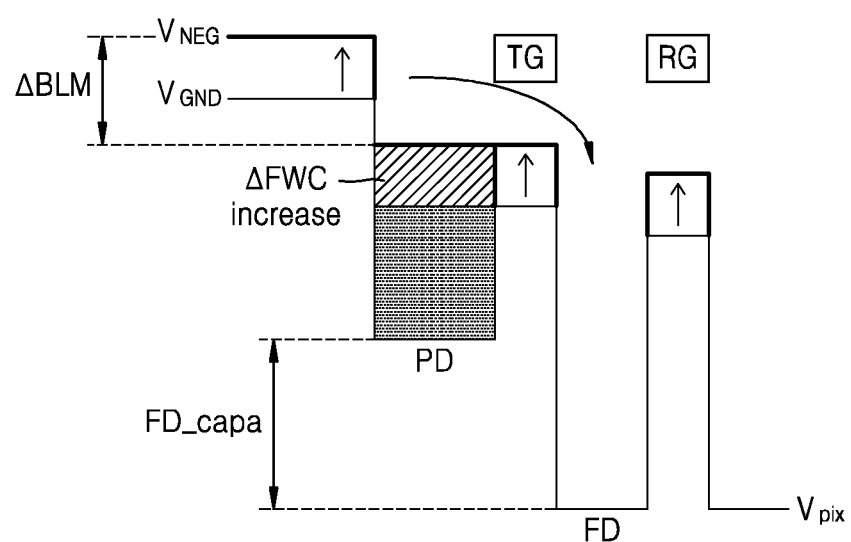
FIG. 9 is a diagram of a potential energy of the pixel of FIG. 6 when a substrate bias voltage of the pixel is biased to a negative (−) voltage.

FIG. 9 is a diagram of a potential energy of the pixel of FIG. 6, when the substrate bias voltage $V_{EPI}$ of the pixel is biased to the first voltage $V_{NEG}$, which is a negative (−) voltage. FIG. 9 can be compared with FIG. 8B illustrating the potential energy of the pixel, whereby the blooming margin may be obtained (or, alternatively secured) by reducing the potential of the transfer gate TG and the reset gate RG.

Referring to FIG. 9, the potential of the photodiode PD may be increased when the substrate bias voltage $V_{EPI}$ of the pixel is biased to the first voltage $V_{NEG}$, which is a negative (−) voltage. To obtain (or, alternatively secure) the increased potential of the photodiode PD as the blooming margin ΔBLM, the potential of the transfer gate TG may be increased by decreasing the voltage of the transfer gate TG. Accordingly, the blooming margin ΔBLM of the photodiode PD may be maintained as in FIG. 8B and the FWC of the photodiode PD may be increased by ΔFWC.

When the FWC of the photodiode increases, there is a need to make the capacity FD_capa of the floating sensing node FD same as the capacity PD_capa of the photodiode PD, by taking into account the charge transfer efficiency to the floating sensing node FD from the photodiode PD. For example, to make the capacity FD_capa of the floating sensing node FD same as the capacity PD_capa of the photodiode PD, the voltage of the reset gate RG may be reduced to increase a potential of the reset gate RG.

Accordingly, as illustrated in FIG. 9, the FWC of the photodiode PD may be increased by biasing the substrate bias voltage $V_{EPI}$ of the pixel 30*a* to the first voltage $V_{NEG}$, which is a negative (−) voltage. Due to the increase in the FWC of the photodiode PD, the blooming margin may be obtained (or, alternatively secured) in order to reduce (or, alternatively prevent) the blooming effect. Also, by decreasing the voltage of the transfer gate TG and the voltage of the reset gate RG, the power consumption according to the pixel operation may be reduced.

Figure 10:
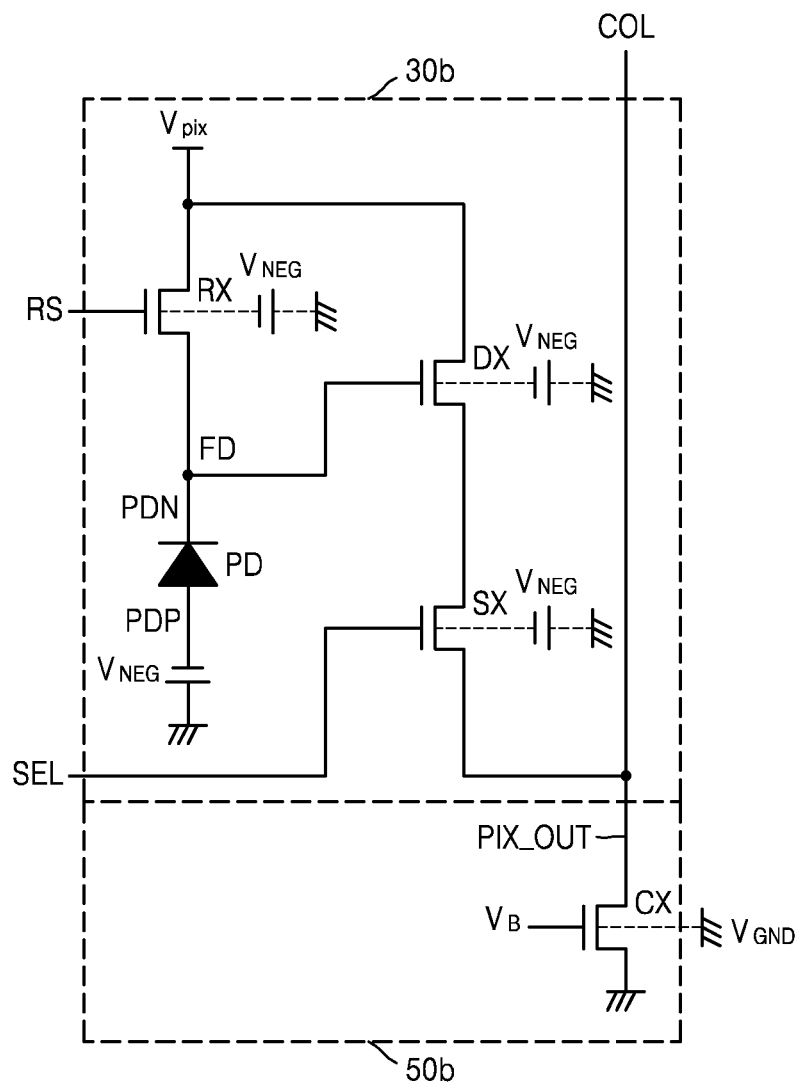
FIGS. 10 through 12 are circuit diagrams of examples of a unit pixel included in the pixel array of FIG. 2.
Figure 11:
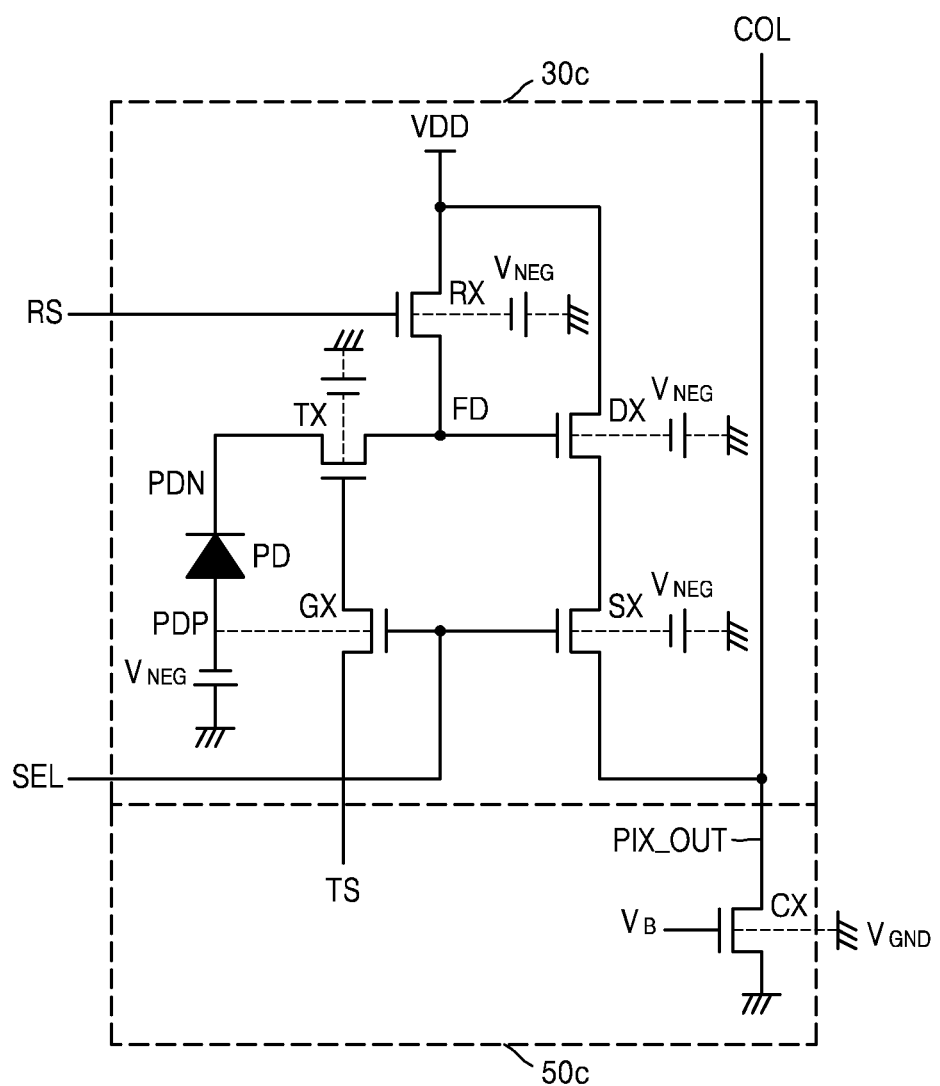
Figure 12:
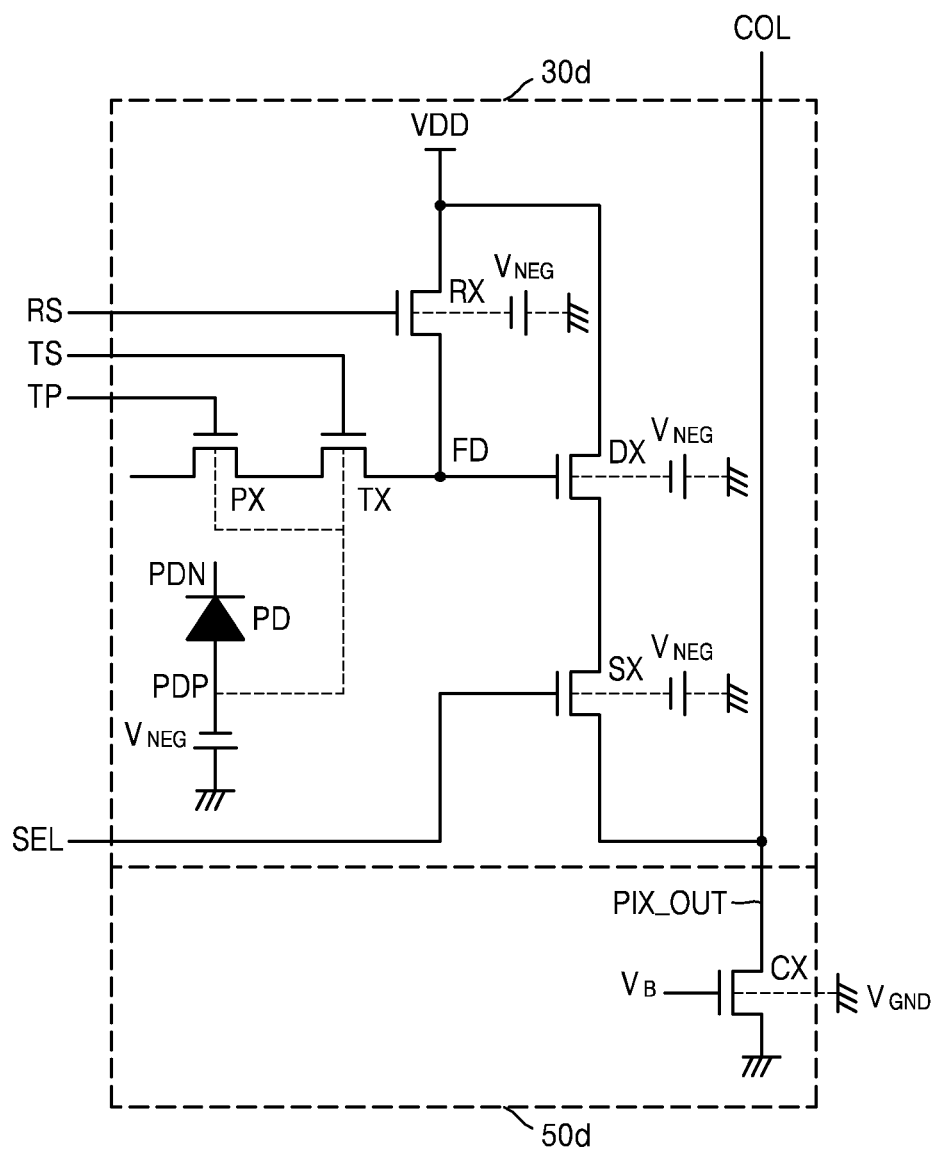

FIGS. 10 through 12 are views of examples of pixels 30*b*, 30*c*, and 30*d* included in the pixel array 140 of FIG. 2.

Referring to FIG. 10, the pixel 30*b* may be formed as a 3-T pixel structure. The pixel 30*b* may include the photodiode PD, a reset transistor RX, a drive transistor DX, and a select transistor SX. A photocharge generated by the photodiode PD may be accumulated in the floating sensing node FD. Based on a potential due to the photocharge accumulated in the floating sensing node FD, the drive transistor DX may amplify the photocharge and transfer the amplified photocharge to the select transistor SX. The select transistor SX may output the pixel signal PIX_OUT via the column line COL based on a select signal SEL.

The photodiode PD of the pixel 30b may be connected between a first node PDP and a second node PDN, a first voltage $V_{NEG}$, which is a negative (−) voltage, may be applied to the second node PDN, and the second node PDN connected to the floating sensing node FD. The first node PDP may be realized as a p-type impurity-doped area, and the second node PDN may be realized as an n-type impurity-doped area. A substrate bias of the reset transistor RX, the drive transistor DX, and the select transistor SX may be biased to the first voltage $V_{NEG}$, which is a negative (−) voltage.

The bias current source 50b may convert a current output via the column line COL in the select transistor SX of the pixel 30b into a voltage. The bias current source 50b may be connected between the column line COL and a ground voltage and may be realized as a transistor CX based on a bias voltage $V_B$. A substrate bias of the transistor CX of the bias current source 50b may be biased to a second voltage $V_{GND}$, which is a ground voltage VSS.

Referring to FIG. 11, the pixel 30c may be formed as a 5-T pixel structure. The pixel 30c may include the photodiode PD, the transfer transistor TX, the reset transistor RX, the drive transistor DX, and the select transistor SX. Additionally, the pixel 30c may include a control transistor GX transferring a transfer control signal TS to a gate of the transfer transistor TX based on a select signal SEL.

The photodiode PD of the pixel 30c may be connected between a first node PDP and a second PDN, a first voltage $V_{NEG}$, which is a negative (−) voltage, may be applied to the first node PDP, and a second node PDN may be connected to the transfer transistor TX. The first node PDP may be realized as a p-type impurity-doped area and the second node PDN may be realized as an n-type impurity-doped area. A substrate bias of the transfer transistor TX, the reset transistor RX, the drive transistor DX, the select transistor SX, and the control transistor GX may be biased to the first voltage $V_{NEG}$, which is a negative (−) voltage.

The bias current source 50c may convert a current output via the column line COL in the select transistor SX of the pixel 30c into a voltage. The bias current source 50c may be connected between the column line COL and a ground voltage and may be realized as a transistor CX responding to a bias voltage $V_B$. A substrate bias of the transistor CX of the bias current source 50c may be biased to the second voltage $V_{GND}$, which is a ground voltage VSS.

Referring to FIG. 12, the pixel 30d may be realized as a 5-T pixel structure. The pixel 30d may include the photodiode PD, the transfer transistor TX, the reset transistor RX, the drive transistor DX, and the select transistor SX. Additionally, the pixel 30d may include a control transistor PX, which may operate in connection with the photodiode PD based on a control signal TP.

The first node PDP of the photodiode PD may be realized as a p-type impurity-doped area connected to the first voltage $V_{NEG}$, which is a negative (−) voltage. A second node PDN of the photodiode PD may be realized as an n-type impurity-doped area which may be a channel area of the control transistor PX. A substrate bias of the transfer transistor TX, the reset transistor RX, the drive transistor DX, the select transistor SX, and the control transistor PX is biased to the first voltage $V_{NEG}$, which is a negative (−) voltage.

The bias current source 50d may convert a current output via the column line COL in the select transistor SX of the pixel 30d into a voltage. The bias current source 50c may be connected between the column line COL and a ground voltage, and may be realized as the transistor CX based on a bias voltage $V_B$. A substrate bias of the transistor CX of the bias current source 50d may be biased to the second voltage $V_{GND}$, which is a ground voltage VSS.

The pixels 30b, 30c, and 30d of FIGS. 10 through 12 may have semiconductor substrates which include the photodiode PD and the transistors RX, TX, DX, SX, GX, and PX, wherein the semiconductor substrates may be substrate biased to the first voltage which is a negative (−) voltage. For example, the semiconductor substrate which becomes the first node $V_{NEG}$ of the photodiode PD may be connected to the first voltage which is a negative (−) voltage so that the FWC of the photodiode PD may be increased. Due to the increase in the FWC of the photodiode PD, the blooming margin of the pixels 30b, 30c, 30d may be obtained (or, alternatively secured) and the blooming effect may be reduced (or, alternatively prevented).

Figure 13:
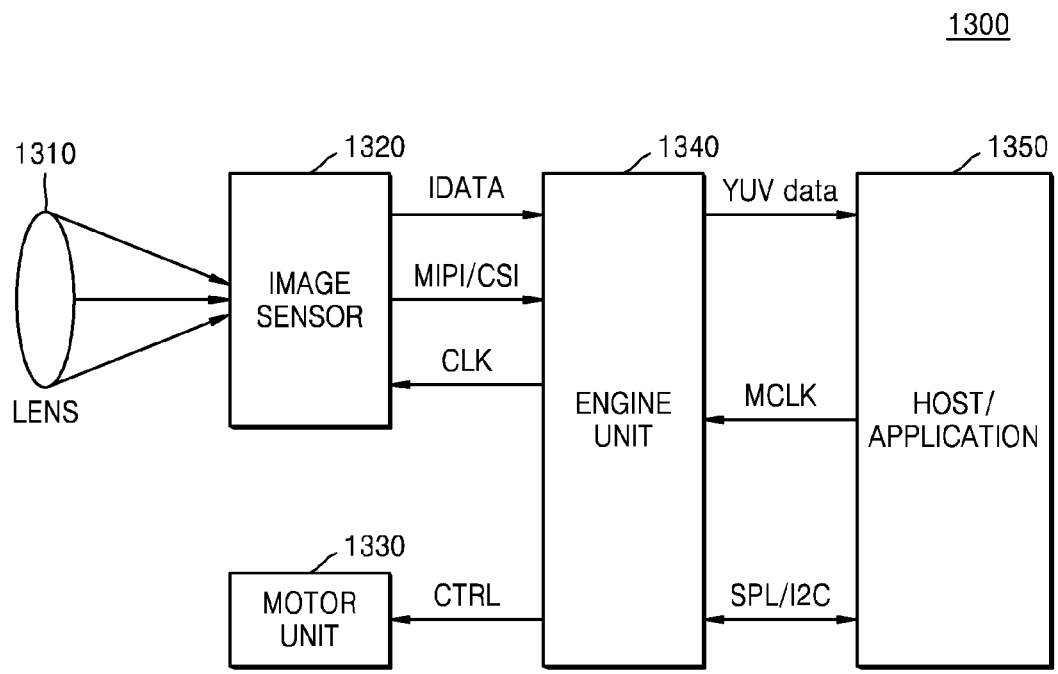
FIG. 13 is a block diagram of a camera system including an image sensor according to example embodiments.

FIG. 13 is a block diagram of a camera system including an image sensor a according to example embodiments.

Referring to FIG. 13, a camera system 1300 may include a lens 1310, an image sensor 1320, a motor unit 1330, and an engine unit 1340.

The lens 1310 may concentrate incident light to a receiving area (for example, a photodiode) of the image sensor 1320. The image sensor 1320 may generate image data IDATA based on the light incident through the lens 1310. The image sensor 1320 may provide the image data IDATA based on a clock signal CLK.

The image sensor 1320 may include pixels formed of a photodiode converting an optical signal to output a photocharge, and transistors sensing the photocharge to output a pixel signal. The photodiode may include a first impurity area having a first conductive type impurity, and a second impurity area surrounding the first impurity area and having a second conductive type impurity. A pixel area of a semiconductor substrate, on which pixels are formed, may be substrate biased to a first voltage which is a negative (−) voltage. A logic circuit area of the semiconductor substrate, which excludes the pixel area, may be substrate biased to a second voltage which is a ground voltage. The second impurity area of the photodiode of the pixel area may be connected to the first voltage which is a negative (−) voltage so that a FWC of the photodiode may be increased. The image sensor 1320 may reduce (or, alternatively prevent) a blooming effect, since the FWC of the photodiode is increased.

According to example embodiments, the image sensor 1320 may communicate with the engine unit 1340 via a mobile industry processor interface (MIPI) and/or a camera serial interface (CSI).

The motor unit 1330 may adjust a focus of the lens 1310 and/or perform shuttering, based on a control signal CTRL received from the engine unit 1340.

The engine unit 1340 may control the image sensor 1320 and the motor unit 1330. The engine unit 1340 may generate YUV data which includes a distance from a subject based on a distance received from the image sensor 1320 and/or image data IDATA, a luminance element Y, a difference U between the luminance element and a blue color element, and a difference V between the luminance element and a red color element, and may generate compression data, such as JPEG data.

The engine unit 1340 may be connected to a host/application 1350 and may provide the YUV data or the JPEG data to the host/application 1350 based on a master clock MCLK. The engine unit 1340 may communicate with the host/application 1350 via a serial peripheral interface (SPI) and a I2C interface.

Figure 14:
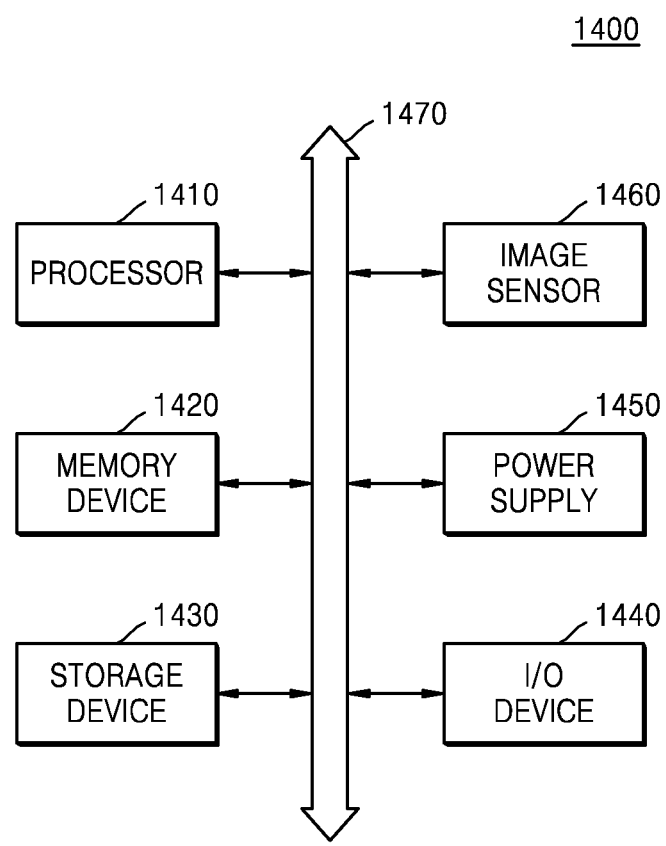
FIG. 14 is a block diagram of a computing system including an image sensor according to example embodiments.

FIG. 14 is a block diagram of a computing system including an image sensor according to example embodiments.

Referring to FIG. 14, a computing system 1400 may include a processor 1410, a memory device 1420, a storage device 1430, an input/output device 1440, a power supply 1450, and/or an image sensor 1460. The computing system 1400 may communicate with a video card, a sound card, a memory card, and/or a universal serial bus (USB) device, or may further include ports which may communicate with other electronic devices.

According to example embodiments, the computing system 1400 may be any mobile systems, such as mobile phones, smart phones, personal digital assistants (PDAs), portable multimedia players (PMPs), digital cameras, music players, portable game consoles, and navigation systems.

The processor 1410 may perform specific operations or tasks. The processor 1410 may include a micro-processor and/or a central processing unit (CPU). The processor 1410 may communicate with the memory device 1420, the storage device 1430, and the input/output device 1440 via a bus 1470 transmitting an address signal, a control signal, and data. According to example embodiments, the processor 1410 may be connected to an extended bus such as peripheral component interconnect (PCI) bus.

The processor 1410 may include a single core processor or a multi-core processor. For example, the processor 1410 may include a dual-core processor, a quad-core processor, and/or a hexa-core processor. According to example embodiments, the processor 1410 may further include a cache memory arranged inside or outside the processor 1410.

The memory device 1420 may include dynamic random access memory (DRAM), mobile DRAM, static random access memory (SRAM), phase change random access memory (PRAM), resistance random access memory (RRAM), and/or magnetic random access memory (MRAM).

The storage device 1430 may include a solid state drive (SSD), a hard disk drive (HDD), CD-ROM, etc.

The input/output device 1440 may include an input device, such as a keyboard, a keypad, a mouse, etc., and an output device such as a printer, a display, etc.

The power supply 1450 may supply an operation voltage to the computing system 1400.

The image sensor 1460 may communicate with the processor 1410 in a network via the bus 1470 or other communication links. The image sensor 1460 and the processor 1410 may be integrated on one chip, but is not limited thereto. For example, the image sensor 1460 and the processor 1410 may be integrated on different chips.

The image sensor 1460 may include pixels formed of a photodiode converting an optical signal to output a photocharge and transistors sensing the photocharge to output a pixel signal. The photodiode may include a first impurity area having a first conductive type impurity, and a second impurity area surrounding the first impurity area and having a second conductive type impurity. A pixel area of a semiconductor substrate, on which the pixels are formed, may be substrate biased to a first voltage which is a negative (−) voltage. A logic circuit area of the semiconductor substrate, which excludes the pixel area, may be substrate biased to a second voltage which is a ground voltage. The second impurity area of the photodiode of the pixel area may be connected to the first voltage which is a negative (−) voltage so that a FWC of the photodiode may be increased. Due to the increase in the FWC of the photodiode, the image sensor 1460 may reduce (or, alternatively prevent) a blooming effect of the pixel.

One or more of the image signal processor 170, the timing generator 110, the sensor control unit 420 and the ramp signal generator 130 may include a processor and a memory (not shown).

The memory may contain computer readable code that, when executed by the processor, configures the processor as a special purpose computer. For example, the code may configure the image signal processor 170 as a special purpose computer to perform image processing on the digital pixel signal from the buffer memory 160.

The computing system 1400 may be mobile systems, such as digital cameras, mobile phones, smart phones, personal digital assistants (PDAs), etc.

Figure 15:
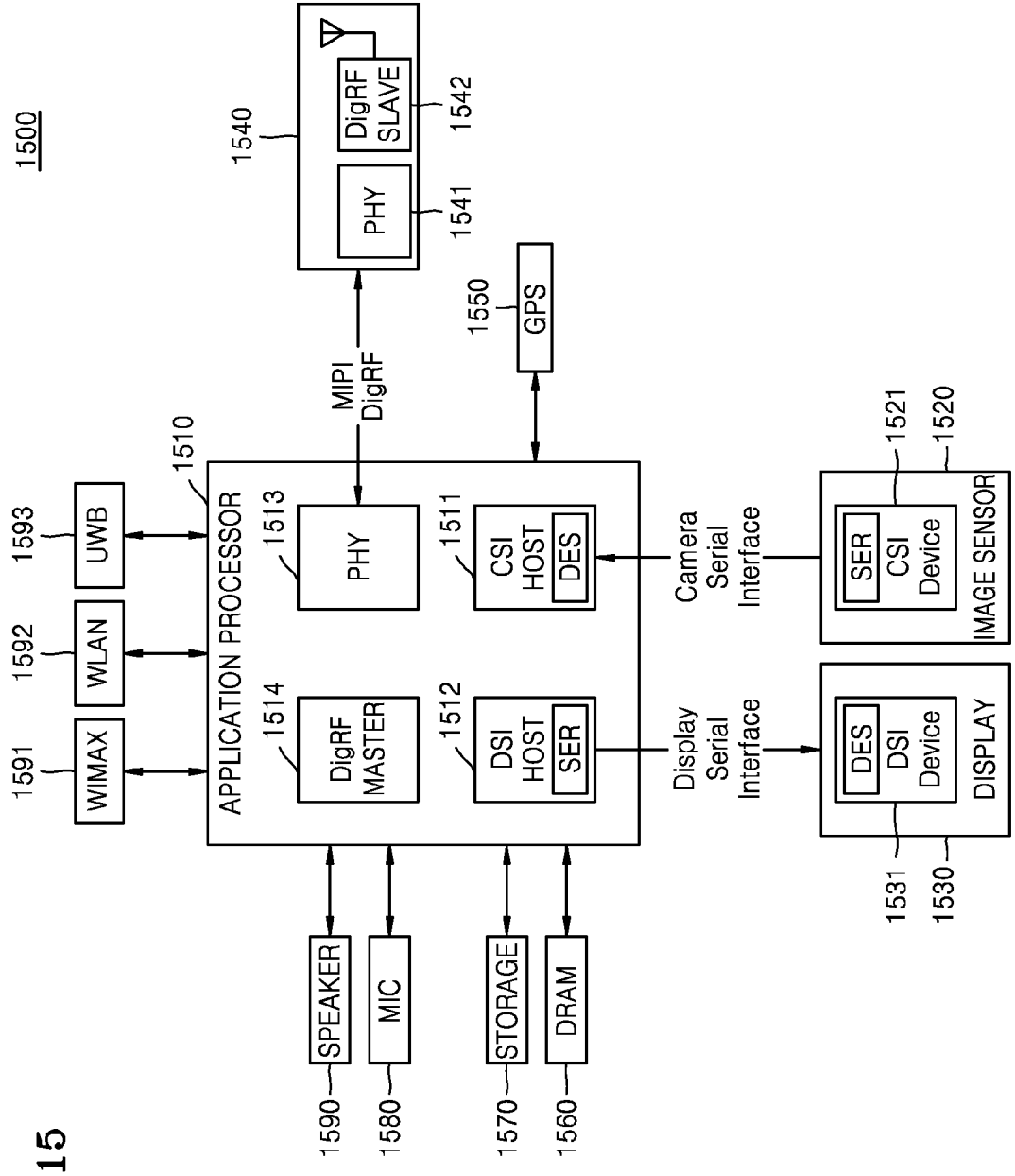
FIG. 15 is a block diagram of an interface of a computing system including an image sensor according to example embodiments.

FIG. 15 is a block diagram of an interface of a computing system 1500 including an image sensor 1520 according to example embodiments.

Referring to FIG. 15, a computing system 1500 may be realized as a data processing device using or supporting an MIPI interface. The computing system 1500 may include an application processor (AP) 1510, an image sensor 1520, and a display 1530. A camera serial interface host 1511 of the application processor (AP) 1510 may perform serial communication with a CSI device 1521 in the image sensor 1520 via a camera serial interface (CSI). According to example embodiments, the CSI host 1511 may include a deserializer and the CSI device 1521 may include a serializer.

The image sensor 1520 may include pixels formed of a photodiode converting an optical signal to output a photocharge and transistors sensing the photocharge to output a pixel signal. The photodiode may include a first impurity area having a first conductive type impurity, and a second impurity area surrounding the first impurity area and having a second conductive type impurity. A pixel area of a semiconductor substrate, on which pixels are formed, may be substrate biased to a first voltage which is a negative (−) voltage A logic circuit area of the semiconductor substrate, which excludes the pixel area, may be substrate biased to a second voltage which is a ground voltage. The first voltage, which is a negative (−) voltage, is applied to the second impurity area of the photodiode of the pixel area, and thus, a full well capacitance (FWC) of the photodiode may be increased. Due to the increase in the FWC, the image sensor 1520 may reduce (or, alternatively prevent) a blooming effect of the pixel.

A display serial interface host 1512 of the AP 1510 may perform serial communication with a display serial interface (DSI) device 1531 of the display 1530 via a DSI. According to example embodiments, the DSI host 1512 may include a serializer (SER) and the DSI device 1531 may include a deserializer DES.

The computing system 1500 may further include a radio frequency (RF) chip 1540 which may perform communication with the AP 1510. A physical layer (PHY) 1513 of the AP 1510 and a physical layer (PHY) 1541 of an RF chip 1540 may exchange data based on a mobile industry processor interface (MIPI) DigRF digital interface. The AP 1510 may include a DigRF master 1514 controlling data transferring and receiving based on the MIPI DigRF digital interface of the PHY 1513, and the RF chip 1540 may include a DigRF slave 1542 controlling data transferring and receiving of the PHY 1541.

The computing system 1500 may include a global positioning system (GPS) 1550, DRAM 1560, a storage 1570, a microphone 1580, and a speaker 1590. Also, the computing system 1500 may perform communication by using worldwide interoperability for microwave access (WIMAX) 1591, wireless local area network (WLAN) 1592, ultra wideband (UWB) 1593, etc.

FIGS. 16 through 20 illustrate multimedia devices including an image sensor according to example embodiments.

The image sensor may include pixels formed of a photodiode converting an optical signal to output a photocharge, and transistors sensing the photocharge to output a pixel signal. The photodiode may include a first impurity area having a first conductive type impurity and a second impurity area surrounding the first impurity area and having a second conductive type impurity. A pixel area of a semiconductor substrate, on which pixels are formed, may be substrate biased to a first voltage which is a negative (−) voltage A logic circuit area of the semiconductor substrate, which excludes the pixel area, may be substrate biased to a second voltage which is a ground voltage. The second impurity area of the photodiode of the pixel area may be connected to the first voltage which is a negative (−) voltage, and thus, a full well capacitance (FWC) of the photodiode may be increased. Accordingly, the image sensor 1320 may reduce (or, alternatively prevent) a blooming effect of the pixel.

Figure 16:
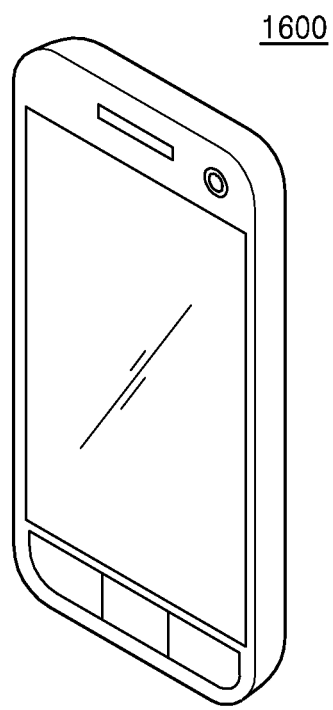
FIGS. 16 through 20 are views of multimedia devices including an image sensor according to example embodiments.
Figure 17:
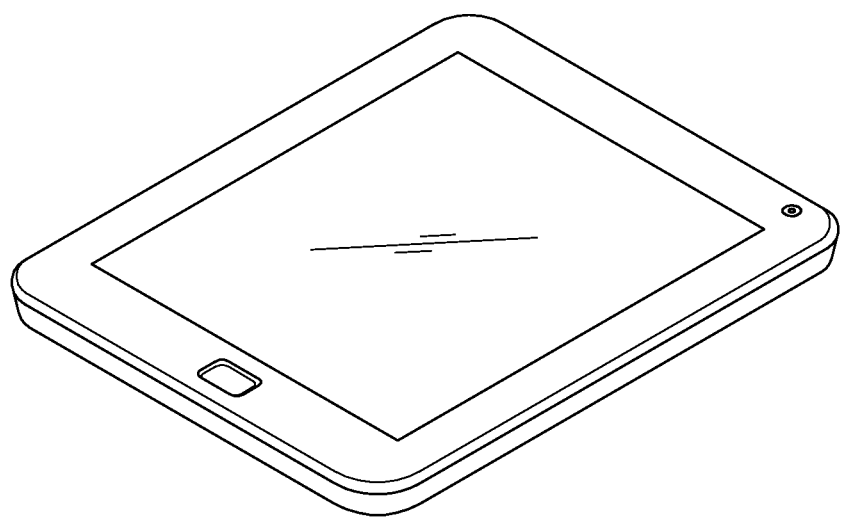
Figure 18:
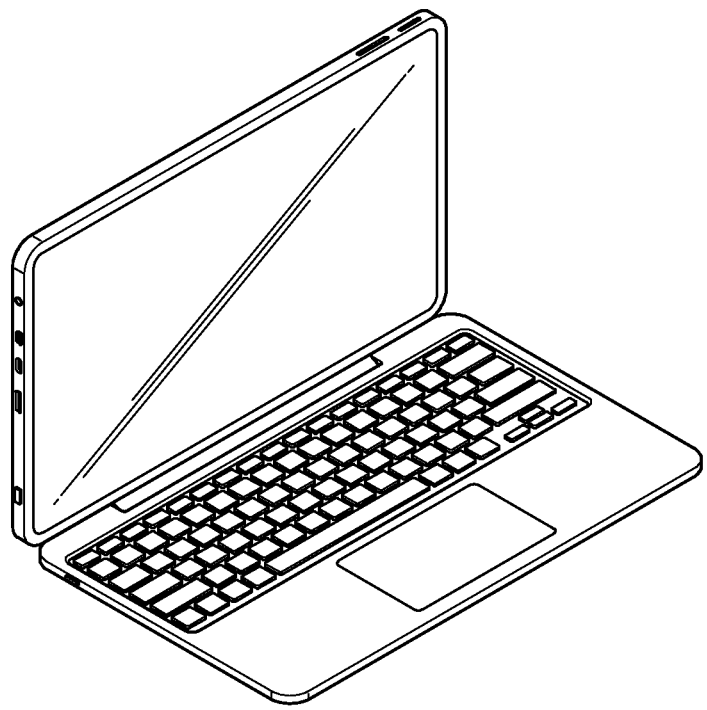
Figure 19:
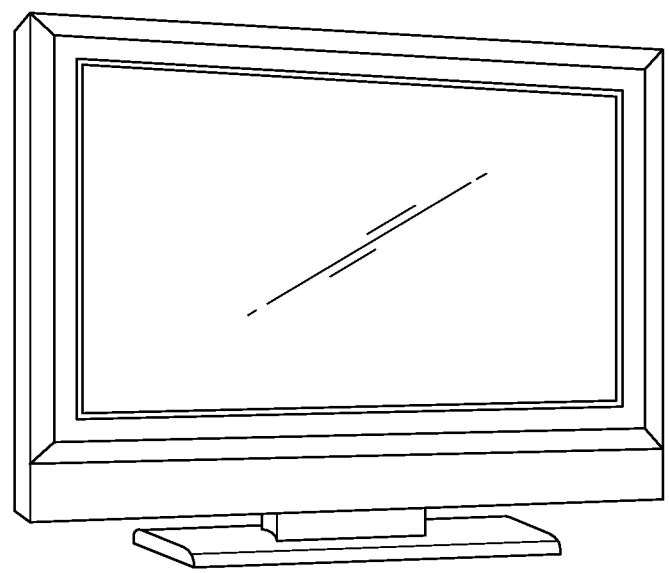
Figure 20:
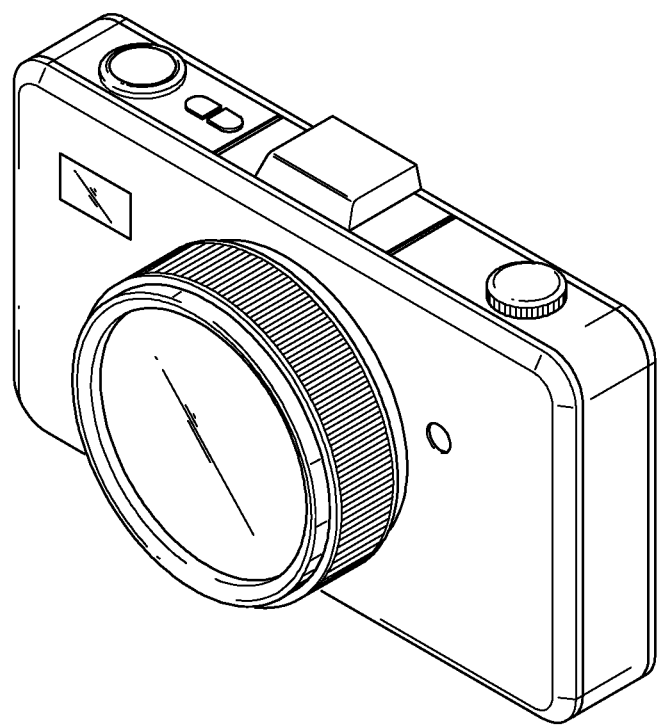

The image sensor according to the example embodiments may be applied to a mobile phone or a smart phone 1600 as illustrated in FIG. 16, or may be applied to a tablet or a smart tablet 1700 as illustrated in FIG. 17. Also, the image sensor according to the example embodiments may be applied to a notebook computer 1800 as illustrated in FIG. 18, and may be applied to a television or a smart television 1900 as illustrated in FIG. 19. The image sensor according to the example embodiments may also be applied to a digital camera or a digital camcorder 2000 as illustrated in FIG. 20.

While the example embodiments of the inventive concepts have been particularly shown and described above, it will be understood to those skilled in the art that various changes in form and details may be made therein without departing from the spirit and scope of the example embodiments of the inventive concepts as defined by the appended claims.

What is claimed is:

1. An image sensor comprising:
  a plurality of pixels on a first region of a semiconductor substrate, the plurality of pixels configured to output pixel signals based on a received optical signal; and
  logic circuits on a second region of the semiconductor substrate, the second region being a different region from the first region, the logic circuits configured to output the pixel signals as image data, wherein,
    the first region is substrate biased to a first voltage and the second region is substrate biased to a second voltage different from the first voltage, and
    the first voltage is a negative voltage.

2. The image sensor of claim 1, wherein the second voltage is a ground voltage.

3. The image sensor of claim 1, wherein each of the plurality of pixels comprises:
  a photodiode configured to output a photocharge based on the optical signal, the photodiode including a first impurity area having a first conductive type impurity and a second impurity area having a second conductive type impurity, the second impurity area surrounding the first impurity area, the second impurity area of the photodiode being in the first region of the semiconductor substrate and the second impurity area having the first voltage applied thereto,
  a sensing node adjacent to the photodiode, the sensing node configured to sense the photocharge, and
  a driver configured to output the sensed photocharge as the pixel signals.

4. The image sensor of claim 3, wherein the first impurity area is an n-type impurity area and the second impurity area is a p-type impurity area.

5. The image sensor of claim 3, wherein each of the plurality of pixels further comprises:
  a transfer transistor between the photodiode and the sensing node, the transfer transistor configured to transfer the photocharge to the sensing node based on a transfer control signal.

6. The image sensor of claim 5, wherein each of the plurality of pixels further comprises:
  a reset transistor between a power voltage and the sensing node, the reset transistor configured to reset the sensing node to the power voltage based on a reset control signal, the transfer transistor and the reset transistor being commonly connected to the sensing node.

7. The image sensor of claim 3, wherein the driver comprises:
  a drive transistor configured to output a signal based on a voltage level of the sensing node, the drive transistor including a source having a power voltage applied thereto.

8. The image sensor of claim 7, wherein the driver further comprises:
  a select transistor configured to output the signal of the drive transistor as the pixel signal based on a selection signal to select a pixel from among the plurality of pixels connected to a line, the select transistor having a source connected to a drain of the drive transistor.

9. The image sensor of claim 1, wherein the logic circuits comprise:
  a current source configured to convert a current into a voltage, the current being associated with the pixel signals, and the current source being a transistor that is substrate biased to the second voltage.

10. The image sensor of claim 1, wherein the logic circuits further comprise:
  an analog-to-digital converter block configured to,
    perform correlated double sampling on the pixel signals,
    compare each of the correlated sampled pixels input to a first terminal thereof with a ramp signal input to a second terminal thereof, and generate a comparison signal based on a result thereof,
    output the comparison signals, and
    output a digital pixel signal by counting the comparison signals based on a clock signal.

11. An image processing device comprising:
  a digital signal processor configured to process image data; and
  an image sensor configured to output the image data, the image sensor including,
    a plurality of pixels on a first region of a semiconductor substrate, the plurality of pixels configured to output pixel signals based on a received optical signal, the first region being substrate biased to a first voltage, and logic circuits on a second region of the semiconductor substrate, the second region being a different region from the first region, the logic circuits configured to output the pixel signals as the image data, the second region being substrate biased to a second voltage different from the first voltage, wherein the first voltage is a negative voltage.

12. The image processing device of claim 11, wherein the second voltage is a ground voltage.

13. The image processing device of claim 11, wherein each of the plurality of pixels comprises:
a photodiode configured to output a photocharge from the optical signal, the photodiode including a first impurity area having a first conductive type impurity and a second impurity area having a second conductive type impurity, the second impurity area surrounding the first impurity area, the second impurity area of the photodiode being in the first region of the semiconductor substrate, and the second impurity area having the first voltage applied thereto,
a sensing node adjacent to the photodiode, the sensing node configured to sense the photocharge, and
a driver configured to output the sensed photocharge as the pixel signals.

14. The image processing device of claim 11, wherein the logic circuits comprise:
a current source configured to convert a current into a voltage, the current being associated with the pixel signals, and the current source being a transistor that is substrate biased to the second voltage.

15. An image sensor comprising:
a semiconductor substrate including,
a first region having one or more pixels connected to a first electrical path, the one or more pixels configured to accumulate photocharges to generate pixel signals based on a received incident light, and
a second region having logic circuits connected to a second electrical path, the second electrical path being a different path from the first electrical path, the logic circuits configured to output the pixel signals as image data, wherein the first electrical path supplies a negative voltage to the first region of the semiconductor substrate.

16. The image sensor of claim 15, wherein the second electrical path supplies a ground voltage to the second region of the semiconductor substrate such that the first region is substrate biased to the negative voltage and the second region is substrate biased to a ground voltage.

17. The image sensor of claim 15, wherein each pixel of the one or more pixels further comprises:
a photodiode configured to,
convert the received incident light to the photocharges, and
output the photocharges, and
transistors configured to sense the photocharges to output the pixel signal.

18. The image sensor of claim 17, wherein the photodiode includes a first impurity area having a first conductive type impurity and a second impurity area having a second conductive type impurity, the second impurity area of the photodiode being in the first region of the semiconductor substrate and the second impurity area having the negative voltage applied thereto.

19. The image sensor of clam claim 18, wherein the first impurity area is an n-type impurity area and the second impurity area is a p-type impurity area.

* * * * *